US008238388B2

(12) United States Patent
Donegan et al.

(10) Patent No.: US 8,238,388 B2
(45) Date of Patent: Aug. 7, 2012

(54) TUNABLE LASER DEVICE AND A METHOD FOR PRODUCING LIGHT OF RESPECTIVE SELECTABLE WAVELENGTHS

(75) Inventors: John F. Donegan, Straffan (IE); Richard Phelan, Thomastown (IE); Wei-Hua Guo, Dublin (IE); Qiao-Yin Lu, Dublin (IE); Brian Corbett, Douglas (IE); Paul Martin Lambkin, Carrigaline (IE); Brendan John Roycroft, Youghal (IE)

(73) Assignees: The Provost, Fellows and Scholars of the College of the Holy and Undivided Trinity of Queen Elizabeth Near Dublin, Dublin (IE); University College Cork, National University of Ireland, Cork, Cork (IE)

( * ) Notice: Subject to any disclaimer, the term of this patent is extended or adjusted under 35 U.S.C. 154(b) by 540 days.

(21) Appl. No.: 12/442,244

(22) PCT Filed: Sep. 20, 2007

(86) PCT No.: PCT/IE2007/000085
§ 371 (c)(1),
(2), (4) Date: Jun. 23, 2009

(87) PCT Pub. No.: WO2008/035320
PCT Pub. Date: Mar. 27, 2008

(65) Prior Publication Data
US 2010/0046562 A1     Feb. 25, 2010

(30) Foreign Application Priority Data
Sep. 20, 2006   (IE) .................................. S2006/0692

(51) Int. Cl.
*H01S 3/098* (2006.01)
*H01S 3/10* (2006.01)

(52) U.S. Cl. ............................... 372/20; 372/18; 372/19
(58) Field of Classification Search .................. 372/18, 372/19, 20
See application file for complete search history.

(56) References Cited

U.S. PATENT DOCUMENTS

| 6,978,057 | B1 | 12/2005 | O'Gorman et al. |
| 2002/0105991 | A1 * | 8/2002 | Coldren et al. ................ 372/50 |
| 2007/0242708 | A1 | 10/2007 | O'Brien et al. |

FOREIGN PATENT DOCUMENTS

| GB | 2 371 920 A | 8/2002 |
| JP | 06-053616 A | 2/1994 |
| JP | 07-273400 A | 10/1995 |
| WO | 2006/008724 A1 | 1/2006 |

* cited by examiner

*Primary Examiner* — Armando Rodriguez
(74) *Attorney, Agent, or Firm* — Sughrue Mion, PLLC

(57) ABSTRACT

A tunable laser device (1) comprises integrally formed first and second ridge waveguides (5, 6). A longitudinally extending ridge (12) defines first and second light guiding regions (19, 20) of the first and second waveguides (5, 6) A plurality of first and second slots (27, 28) extending laterally in the ridge (12) adjacent the first and second waveguides (5, 6), produce first and second mirror loss spectra of the respective first and second waveguides (5, 6) with minimum peak values at respective first and second wavelength values. The spacing between the second slots (28) is different to that between the first slots (27) so that with one exception the minimum peak values of the first and second mirror loss spectrum occur at different wavelength values. The first and second waveguides (5, 6) are independently pumped with variable currents to selectively vary the common wavelength at which the minimum peak values of the first and second mirror loss spectra occur to produce Vernier tuning of the device.

21 Claims, 14 Drawing Sheets

RHS Feedback section

Figure 1:
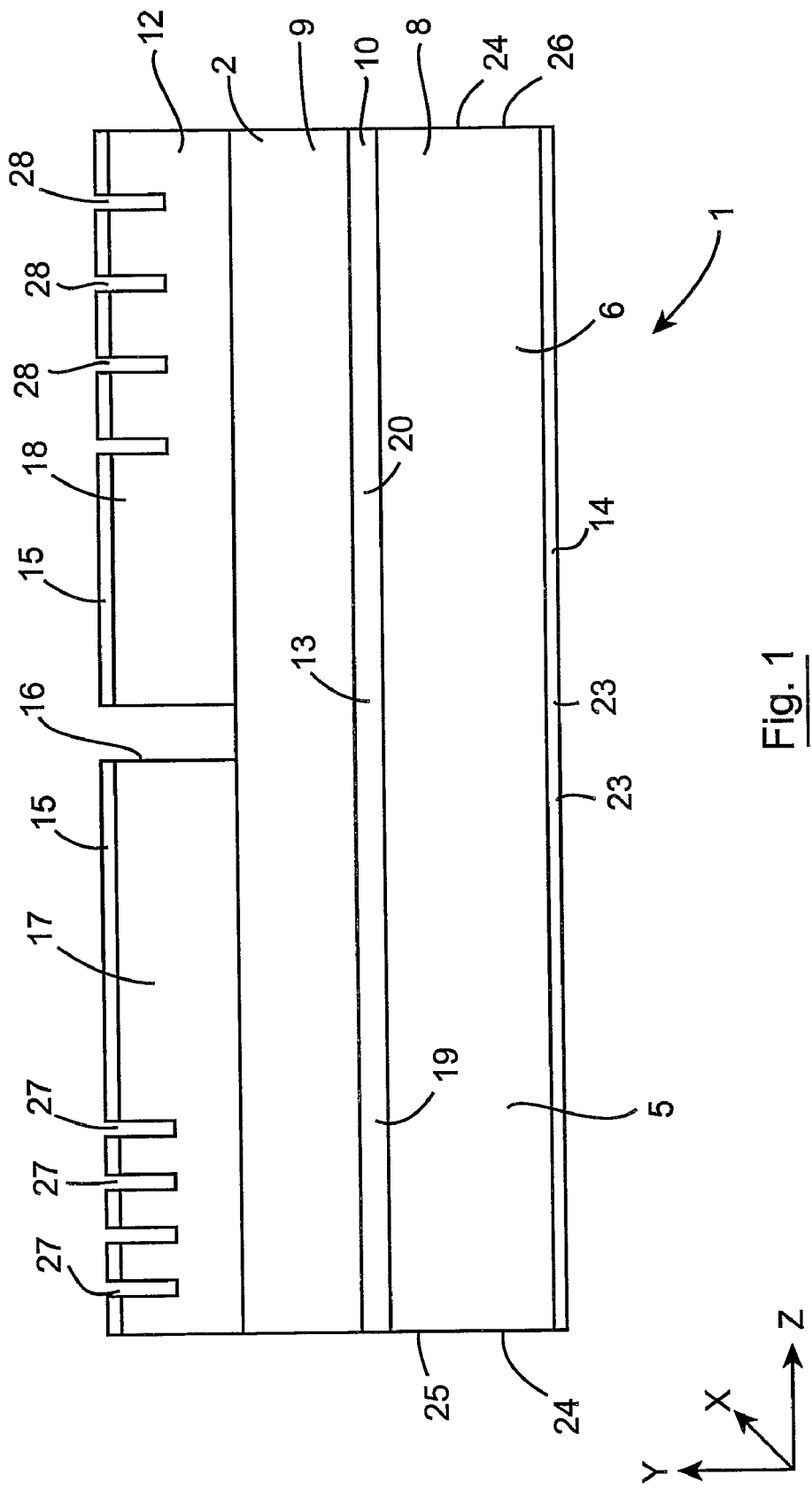

Modulus of reflectivity from a grid of 10 slots as a function of ϕs (units of

Threshold gain spectrum

Calculated reflectance from 10 slots and the end facet

Reflectance from 10 slots and the end facet when a phase shift is used

The reflectance spectra for the left and right mirrors (and the their Product) when the index of one mirror is changed by 0.008. Compare to Fig.10

The SMSR spectra when the index of one mirror is changed by 0.008.

Schematic of two section SFP laser

Calculated mirror loss spectrum for two section device incorporating a different slot pattern in section A and B Calculated mirror loss spectrum for two section device super mode hops, are obtained by tuning one section while leaving the other one fixed.

L-I, V-I characteristics

The emission spectrum of the WT-SFP laser, measured at a temperature of 25°C, section A & B biased at 40mA The emission spectrum and SMSR of the WT-SFP laser section A & B biased at 40 mA versus heat sink temperature The emission spectrum of the WT-SFP as a function of section A and section B bias current at a constant heat sink temperature Reflection and transmission amplitude of single slot vs. slot depth calculated by the 2D SMM model Reflection amplitude of single slot vs. slot width

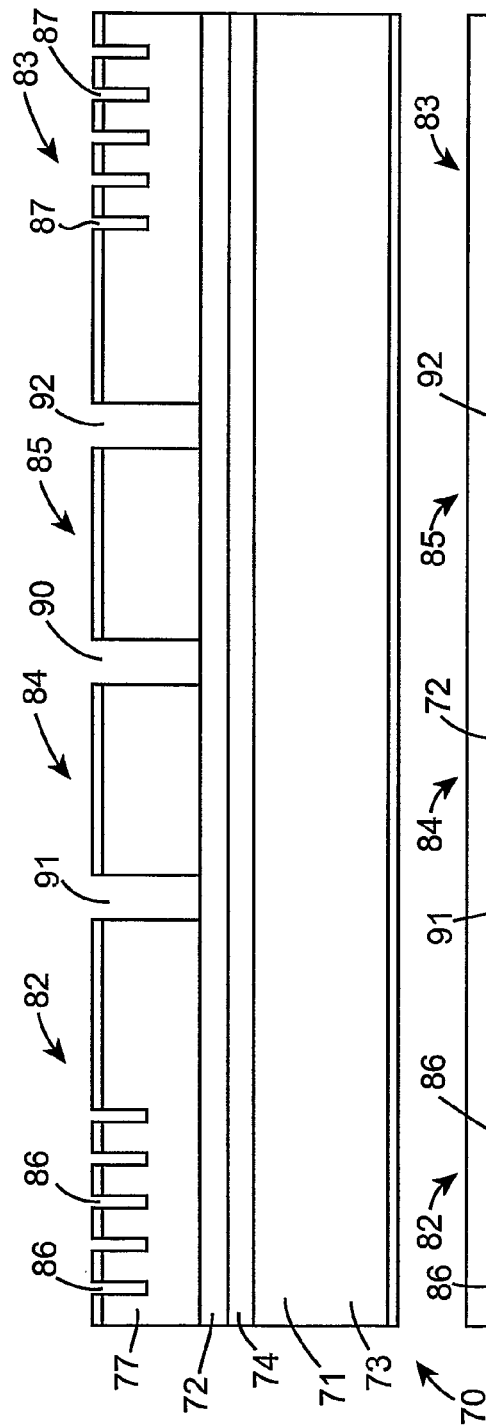

TUNABLE LASER DEVICE AND A METHOD FOR PRODUCING LIGHT OF RESPECTIVE SELECTABLE WAVELENGTHS

The present invention relates to a tunable laser device and to a method for producing light of respective selectable wavelengths.

Optical telecommunication systems are increasingly reliant on the use of a precise wavelength of an optical signal in order to route the optical signal. The wavelength can be defined or altered centrally or locally which require the provision of wavelength sources with different properties. If fixed, the required wavelength can be provided by a single frequency laser which is temperature controlled to maintain the precise International Telecommunication Union (ITU) frequency. Such a laser can be realised by known principles such as distributed feedback (DFB) or by controlled cavity reflectivities using a slotted Fabry-Perot (SFP) device. Replacement or addition of a wavelength channel requires a precise wavelength source. It would be advantageous if the source can be generic and tuned to the desired wavelength. In optical telecommunications there is also a requirement to switch incoming optical signals on one wavelength channel to a different wavelength channel based either on detection of the data or the retransmission on the new channel or based on keeping the signal in the optical domain. In such cases it is desirable to switch between wavelength channels in a timeframe of less than twenty nanoseconds.

Additionally, optical sensor systems for gas detection are based on the precise and characteristic absorption spectra of the constituent molecules and atoms. Wavelength tunable sources are required to perform these measurements. It would be advantageous to have a tunable light source to cover a wide spectral range and thus be generic to detection of many different gas species.

There is therefore a need for a tunable laser device for producing light of selectable wavelengths.

The present invention is directed towards providing such a tunable laser device, and the invention is also directed towards providing a method for producing light of respective selectable wavelengths.

According to the invention there is provided a tunable laser device for producing light of respective selectable wavelengths, the tunable laser device comprising:

a first ridge waveguide extending between a first proximal end and a first distal end, and having a first ridge defining a first light guiding region extending in a longitudinal direction between the first proximal end and the first distal end thereof, a second ridge waveguide extending between a second proximal end and a second distal end, and having a second ridge defining a second light guiding region extending in a longitudinal direction between the second proximal end and the second distal end thereof, the first and second light guiding regions communicating through the first and second proximal ends thereof, and emitting light of the selectable wavelength through one of the first and second distal ends, at least two first refractive index altering means spaced apart along the first ridge of the first waveguide for altering the refractive index of the first light guiding region at spaced apart locations therein to produce a first mirror loss spectrum with minimum peak values at respective first wavelength values, at least two second refractive index altering means spaced apart along the second ridge of the second waveguide for altering the refractive index of the second light guiding region at spaced apart locations therein to produce a second mirror loss spectrum with minimum peak values at respective second wavelength values, and a refractive index varying means for selectively varying the refractive index of at least the first light guiding region for in turn varying the first mirror loss spectrum until one of the first wavelength values is similar to one of the second wavelength values to produce light of a selected one of the wavelengths.

In one embodiment of the invention the first and second refractive index altering means are adapted for altering the refractive index of the respective first and second light guiding regions at locations corresponding to the respective locations of the first and second refractive index altering means.

In another embodiment of the invention the first and second refractive index altering means are located so that the first and second mirror loss spectra produced by the respective first and second light guiding regions are different when the refractive index altering means is inactive.

In a further embodiment of the invention the first and second refractive index altering means are located so that the first and second mirror loss spectra produced by the respective first and second light guiding regions are the same when the refractive index altering means is inactive.

In another embodiment of the invention the spacing between the second refractive index altering means is different to the spacing between the first refractive index altering means.

Preferably, the refractive index varying means comprises a means for selectively varying the refractive indices of the respective first and second light guiding regions.

Advantageously, the refractive index varying means comprises a means for selectively varying the refractive indices of the respective first and second light guiding regions independently of each other.

Ideally, the refractive index varying means comprises a first current injecting means for injecting a first electrical current into the first waveguide to vary the refractive index of the first light guiding region.

Preferably, the first current injecting means comprises a means for selectively varying the first current.

Advantageously, the refractive index varying means comprises a second current injecting means for injecting a second electrical current into the second waveguide to vary the refractive index of the second light guiding region.

Preferably, the second current injecting means comprises a means for selectively varying the second current.

Ideally, the first and second current injecting means are independently operable for independently selecting the values of the first and second currents.

In another embodiment of the invention a gain section is located intermediate the first and second waveguides for producing light for the first and second waveguides.

Preferably, the gain section is adapted to be pumped with a pumping current independently of the first and second waveguides.

In one embodiment of the invention the first and second waveguides are passive waveguides.

In another embodiment of the invention the first and second waveguides are active waveguides and are adapted to be pumped with respective pumping currents independently of each other.

In a further embodiment a phase section is located intermediate the gain section and one of the first and second waveguides for controlling the phase of the light.

Preferably, the phase section is adapted to be injected with a phase controlling current independently of the gain section and the first and second waveguides.

In one embodiment of the invention each first refractive index altering means is adapted for causing a corresponding refractive index perturbation in the first light guiding region.

In another embodiment of the invention each second refractive index altering means is adapted for causing a corresponding refractive index perturbation in the second light guiding region.

In a further embodiment of the invention each first refractive index altering means comprises a first slot formed in the first ridge of the first waveguide and extending laterally across the first ridge.

In another embodiment of the invention each second refractive index altering means comprises a second slot formed in the second ridge of the second waveguide and extending laterally across the second ridge.

Preferably, the first and second slots extend completely across the respective first and second ridges of the first and second waveguides, respectively.

In another embodiment of the invention the spacing between the first refractive index altering means is determined as a function of the centre wavelength of the range of wavelengths of light over which the first ridge waveguide is operable.

In a further embodiment of the invention the spacing between the first refractive index altering means is determined as a function of the average effective refractive index of the first light guiding region of the first waveguide.

In one embodiment of the invention the spacing between the first refractive index altering means is determined from the equation:

$$d_1 = \frac{N_1 \lambda}{4 n_{1\mathit{eff},ave}}$$

where $d_1$ is the spacing between adjacent ones of the first refractive index altering means, centre to centre, $N_1$ is an integer from one upwards, $\lambda$ is the centre wavelength of the range of wavelengths of light over which the laser device is to be tunable, and $n_{1\ \mathit{eff},\ ave}$ is the average effective refractive index of the first light guiding region.

Preferably, the spacing between the second refractive index altering means is determined as a function of the centre wavelength of the range of wavelengths of light over which the second ridge waveguide is operable.

Advantageously, the spacing between the second refractive index altering means is determined as a function of the average effective refractive index of the second light guiding region of the second waveguide.

In one embodiment of the invention the spacing between the second refractive index altering means is determined by the equation:

$$d_2 = \frac{N_2 \lambda}{4 n_{2\mathit{eff},ave}}$$

where $d_2$ is the spacing between adjacent ones of the second refractive index altering means, centre to centre, $N_2$ is an integer from one upwards, $\lambda$ is the centre wavelength of the range of wavelengths of light over which the laser device is to be tunable, and $n_{2\ \mathit{eff},\ ave}$ is the average effective refractive index of the second light guiding region.

In another embodiment of the invention the value of $N_2$ is different to the value of $N_1$.

In another embodiment of the invention the respective first refractive index altering means are located towards the first distal end of the first waveguide, and the respective second refractive index altering means are located towards the second distal end of the second waveguide.

Preferably, the one of the first refractive index altering means which is closest to the first distal end of the first waveguide is spaced apart from the first distal end a distance substantially similar to the spacing between adjacent ones of the first refractive index altering means.

Advantageously, the one of the second refractive index altering means which is closest to the second distal end of the second waveguide is spaced apart from the second distal end a distance substantially similar to the spacing between adjacent ones of the second refractive index altering means.

In another embodiment of the invention the first and second light guiding regions of the respective first and second waveguides are aligned longitudinally with each other for communication therebetween through the first and second proximal ends thereof.

In another embodiment of the invention the first and second waveguides are integrally formed from a ridge waveguide having a single light guiding region.

In a further embodiment of the invention the first and second ridges of the respective first and second waveguides are formed from a single ridge.

Preferably, an electrical isolating means is provided for substantially electrically isolating the first current in the first light guiding region and the second current in the second light guiding region from each other.

Advantageously, the electrical isolating means comprises an isolating slot formed in and extending laterally of the ridge intermediate the first and second waveguides.

In one embodiment of the invention a longitudinally extending active layer is located between a lower longitudinally extending cladding layer and an upper longitudinally extending cladding layer, the respective active layer and the lower and upper cladding layers forming respective first and second active layers and first and second lower and upper cladding layers of the respective first and second waveguides.

Preferably, the respective active layer and the lower and upper cladding layers form an active layer and lower and upper cladding layers of the gain section.

In one embodiment of the invention a lower conducting layer is provided on the under surface of the lower cladding layer, and an upper conducting layer is provided on a top surface of the ridge of the respective first and second waveguides for facilitating injection of the first and second currents into the first and second waveguides.

In one embodiment of the invention the active layer comprises at least one quantum well layer.

In another embodiment of the invention the active layer comprises a plurality of quantum well layers.

In a further embodiment of the invention the active layer comprises at least one quantum dot.

In a still further embodiment of the invention the active layer comprises a plurality of quantum dots.

In one embodiment of the invention the first and second ridge waveguides are of a semiconductor material.

In another embodiment of the invention the first and second ridge waveguides comprise first and second laser diodes, respectively.

In a further embodiment of the invention the wavelength of light produced by the tunable laser device is selected using a Vernier principle.

Additionally the invention provides a method for producing light of respective selectable wavelengths, the method comprising:

provided a first ridge waveguide extending between a first proximal end and a first distal end, and having a first ridge defining a first light guiding region extending in a longitudinal direction between the first proximal end and the first distal end thereof, providing a second ridge waveguide extending between a second proximal end and a second distal end, and having a second ridge defining a second light guiding region extending in a longitudinal direction between the second proximal end and the second distal end thereof, providing the first and second light guiding regions communicating through the first and second proximal ends thereof, and emitting light of the selectable wavelength through one of the first and second distal ends, providing at least two first refractive index altering means spaced apart along the first ridge of the first waveguide for altering the refractive index of the first light guiding region at spaced apart locations therein to produce a first mirror loss spectrum with minimum peak values at respective first wavelength values, providing at least two second refractive index altering means spaced apart along the second ridge of the second waveguide for altering the refractive index of the second light guiding region at spaced apart locations therein to produce a second mirror loss spectrum with minimum peak values at respective second wavelength values, providing a refractive index varying means for selectively varying the refractive index of at least the first light guiding region, and varying the first mirror loss spectrum by operating the refractive index varying means to vary the refractive index of the first light guiding region until one of the first wavelength values is similar to the one of the second wavelength values at which the minimum peak value of the second mirror loss spectrum corresponding to the selected wavelength occurs.

The advantages of the tunable laser devices according to the invention are many. A particularly important advantage of the tunable laser devices according to the invention is the simplicity of the tunable laser devices, and in particular, the simplicity of the manufacturing process required to produce the tunable laser devices, and the actual operation of the tunable laser devices. The tunable laser devices according to the invention can be produced by a relatively straightforward and uncomplicated fabrication process. In particular, no regrowth steps are required in the fabrication process for producing the tunable laser devices according to the invention, as opposed to other known tunable laser devices in which the fabrication processes are considerably more complicated, and require a number of regrowth steps, for example, in distributed feedback devices, where the manufacturing process is relatively complex and requires a number of regrowth steps. Because the fabrication process required to produce the tunable laser devices according to the invention is a relatively simple and straightforward fabrication process, it has a strong potential for increased wafer yield. Where the reflecting means are provided by lateral slots, only one wafer growth is needed, and the lateral slots may be formed by any suitable conventional method, for example, by conventional photolithography and dry etching. Indeed, the fabrication process required for producing the tunable laser devices according to the invention, particularly where the reflecting means is provided by lateral slots, is not much more complex than the fabrication process required for fabricating a ridge waveguide laser device. Additionally, control of the tunable laser device for producing light of a selectable wavelength is a relatively simple and straightforward operation. All that is required is two independently variable injection currents, or two independently variable pumping currents, depending on the construction of the tunable laser device.

Where the tunable laser device is provided as a two section device with two active waveguide or feedback sections, two pumping currents are required, and by varying one or both of the pumping currents the refractive index of the light guiding regions of the corresponding one or both of the active sections is varied for varying the wavelength of light being produced by the laser device. In a three section device, where a central gain section is provided intermediate the two waveguides or feedbacks, with the two feedback sections provided at respective opposite ends of the gain section, and with the reflecting means being provided in the respective feedback sections, the two feedback sections may be passive or active sections. If the two feedback sections are passive sections, only the gain section is pumped, and two independently variable injection currents are injected into the respective feedback sections. In such a tunable laser device, the respective injection currents are varied for varying the refractive indices of the light guiding regions of the two feedback sections, for in turn varying the wavelength of light produced. Alternatively, where the two feedback sections are also active sections, the gain section and the two feedback sections are pumped with three independently variable pumping currents, and the pumping currents which pump the two feedback sections are independently varied for varying the refractive indices of the light guiding regions of the two feedback sections for producing light of selectable wavelength. While it is preferable in the case of a three section tunable laser device which comprises a central gain section and two feedback sections to only pump the central gain section, and to operate the two feedback sections as passive sections, injecting respective independently variable currents into the two feedback sections for varying the wavelength of light produced, since operating the two feedback sections as passive sections provides more precise wavelength selection, a disadvantage of operating the feedback sections as passive sections is that the reflecting means result in power loss, and in order to compensate for the power loss, it is sometimes preferable to operate the feedback sections as active sections and pump the feedback sections independently with respective independently variable pumping currents, independently of each other and independently of the central gain section.

Figure 2:
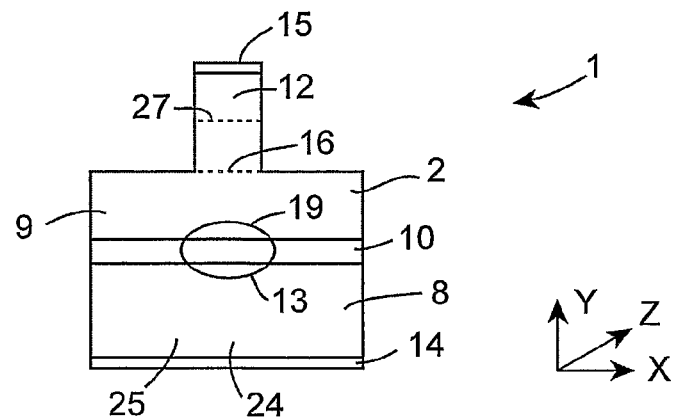
Figure 24:
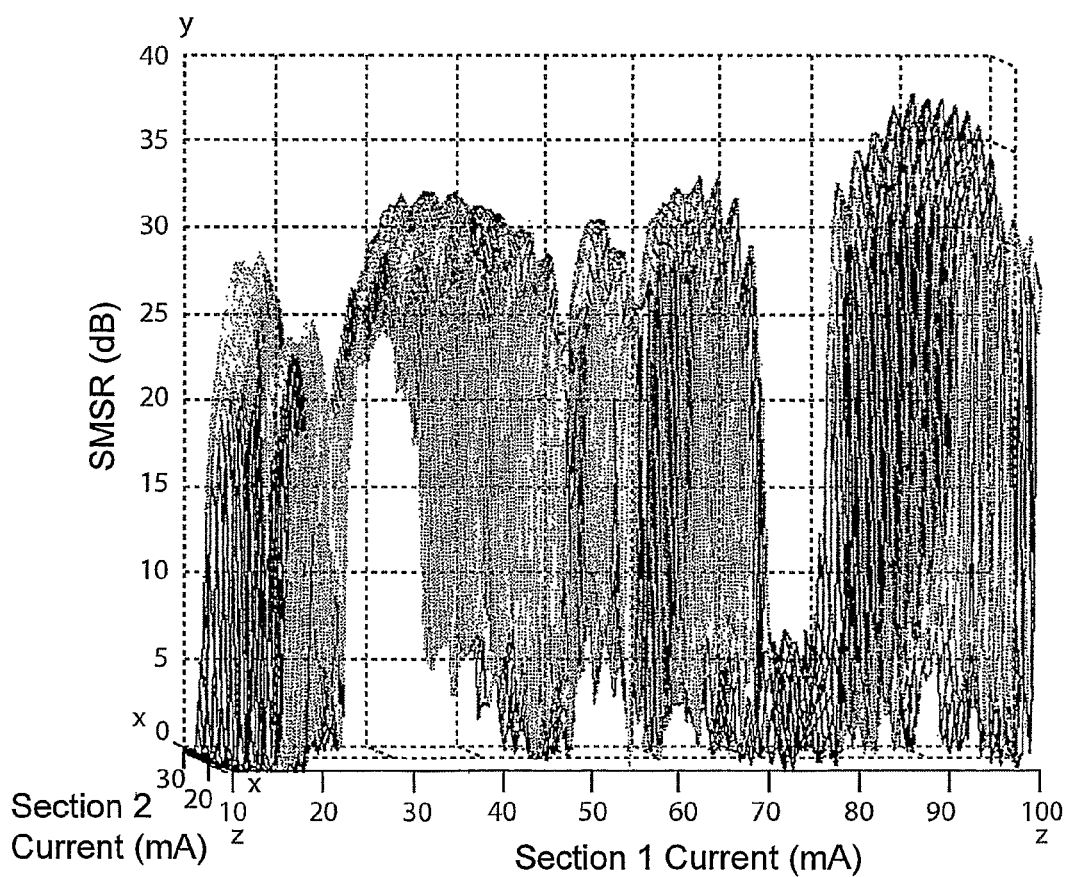
Figure 3:
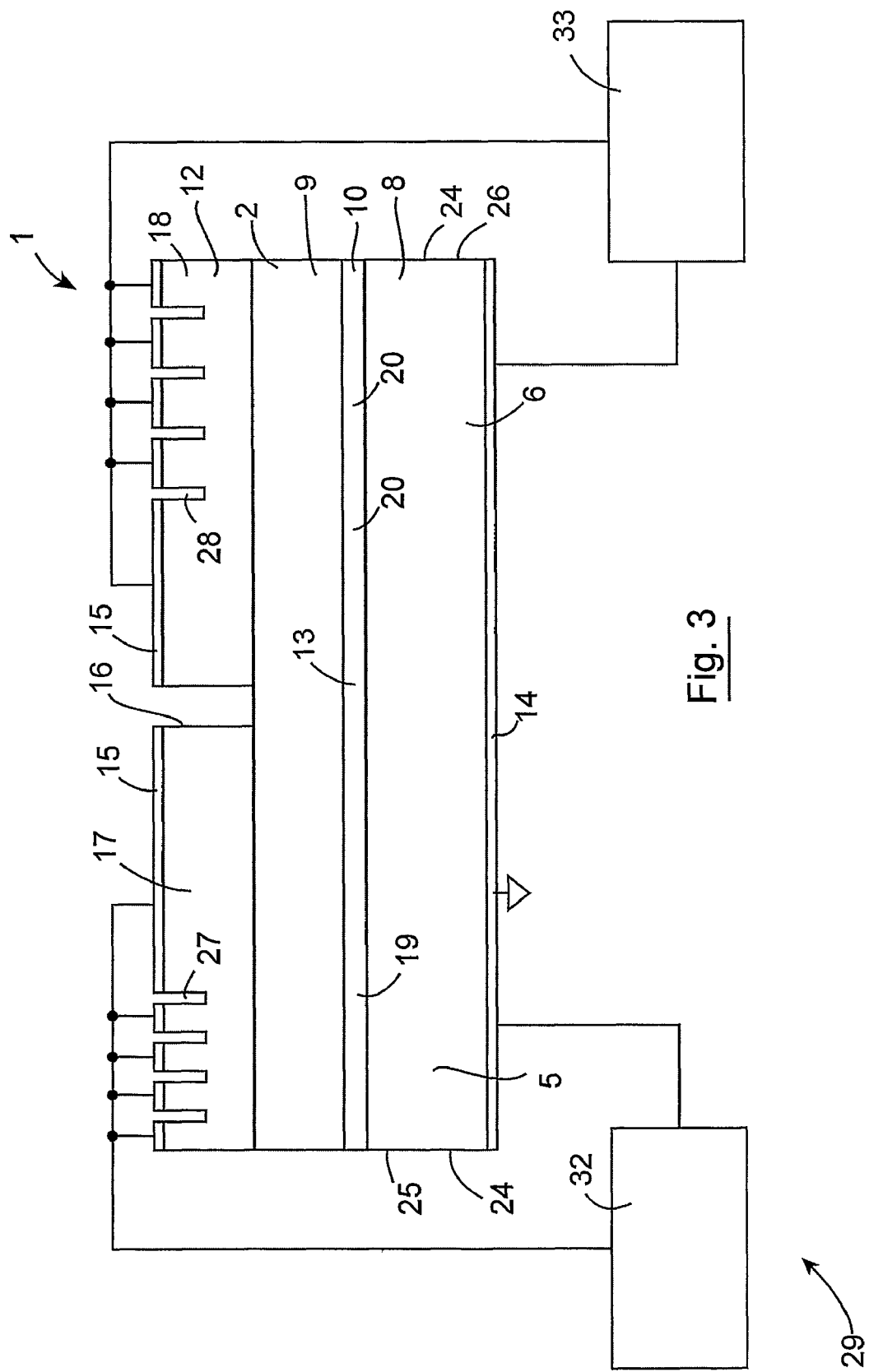
Figure 4:
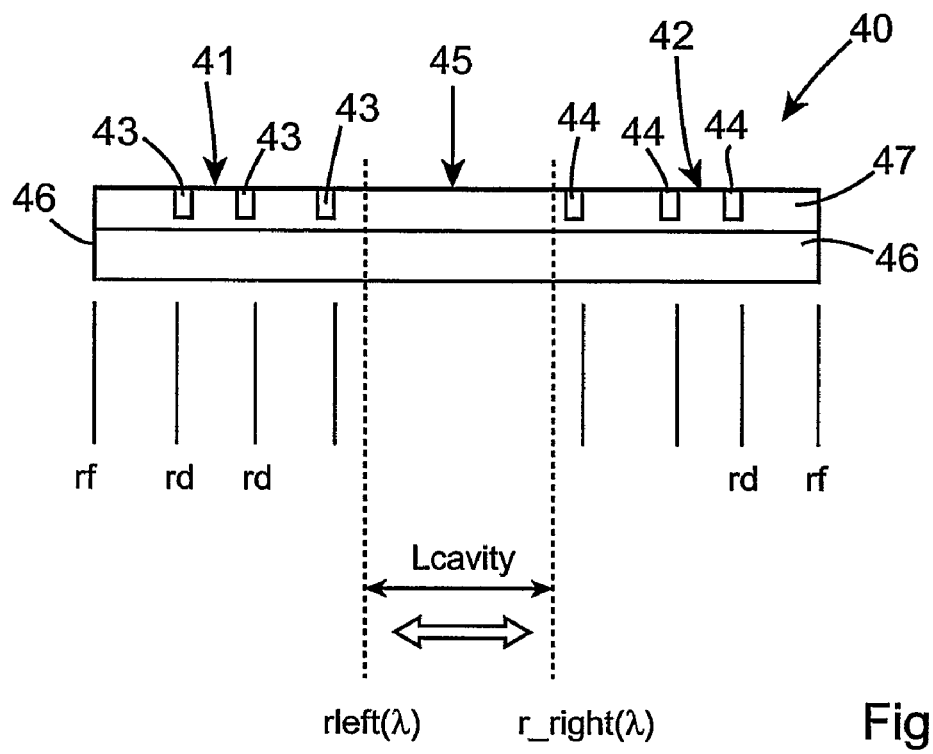
Figure 5:
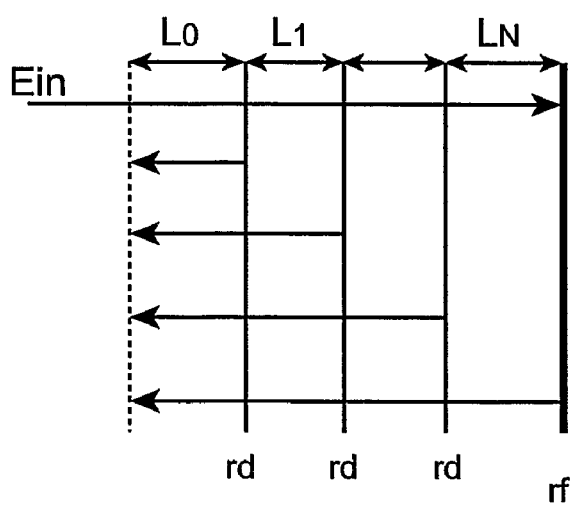
Figure 6:
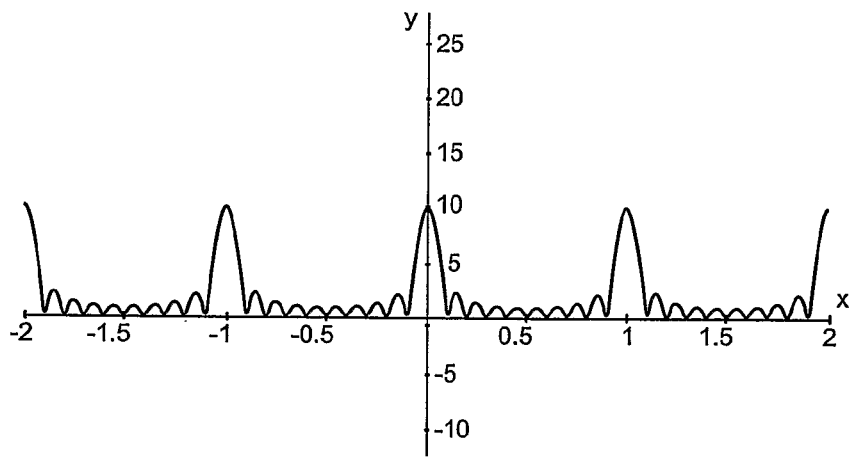
Figure 9:
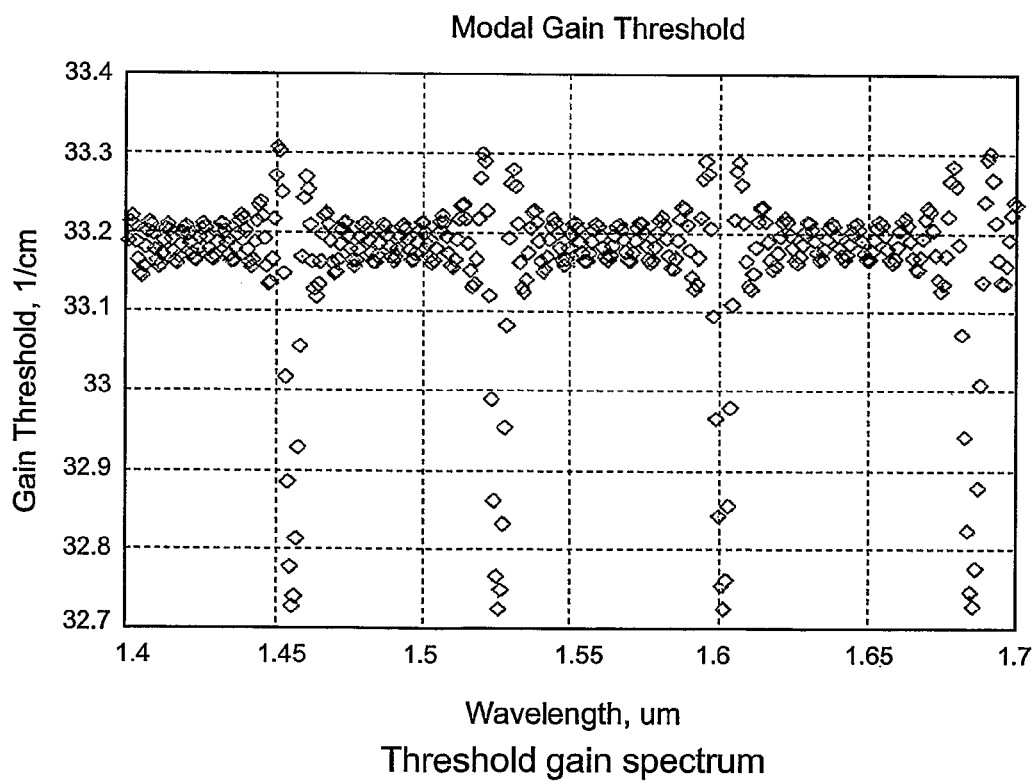
Figure 7:
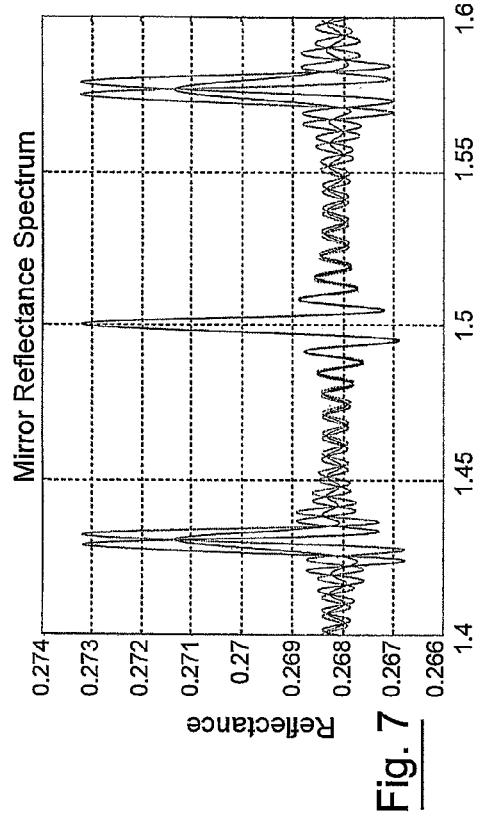
Figure 8:
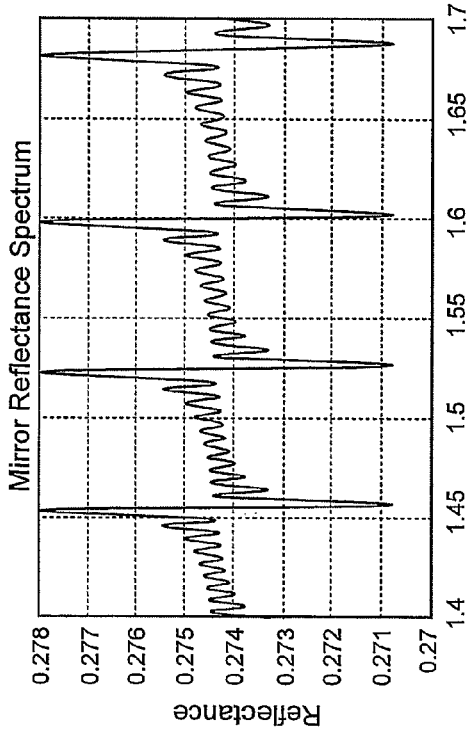
Figure 10:
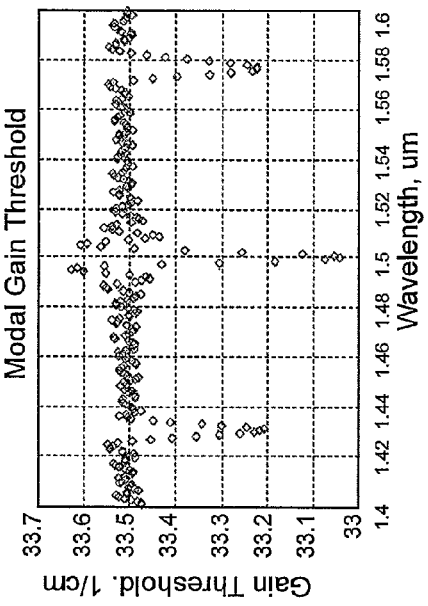
Figure 11:
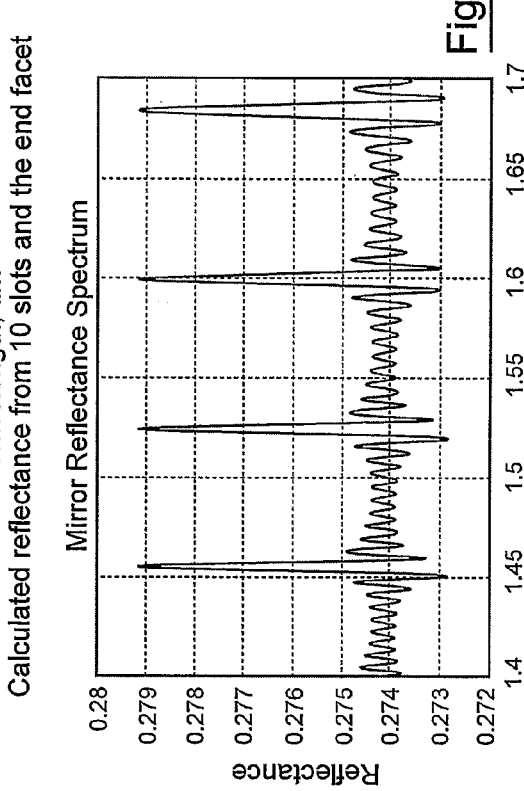
Figure 12:
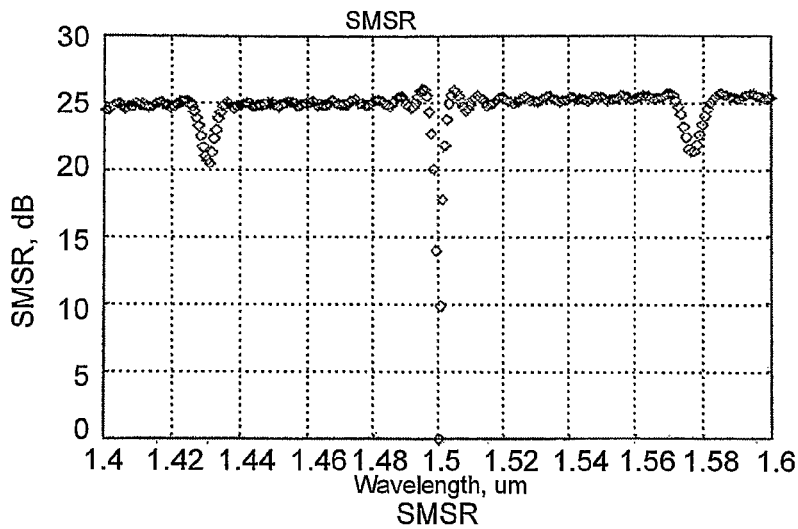
Figure 13:
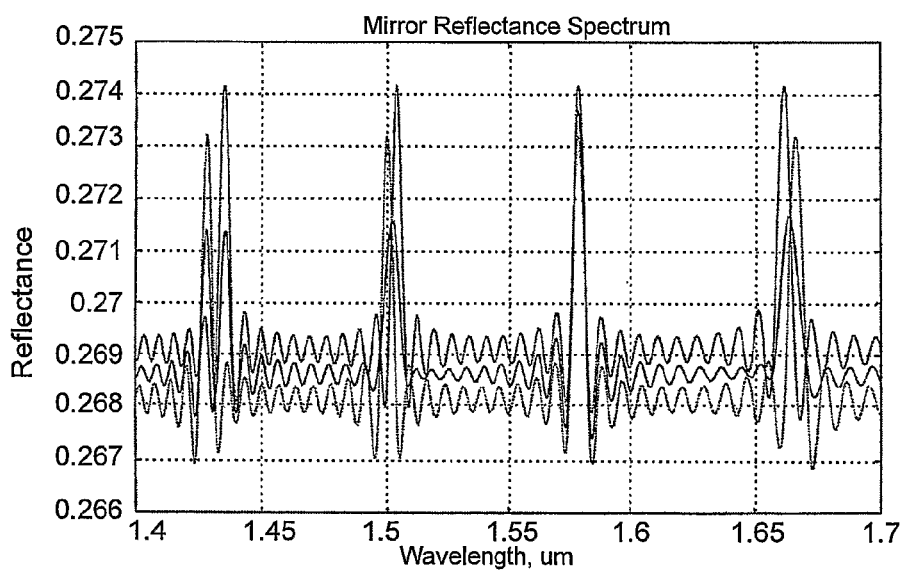
Figure 14:
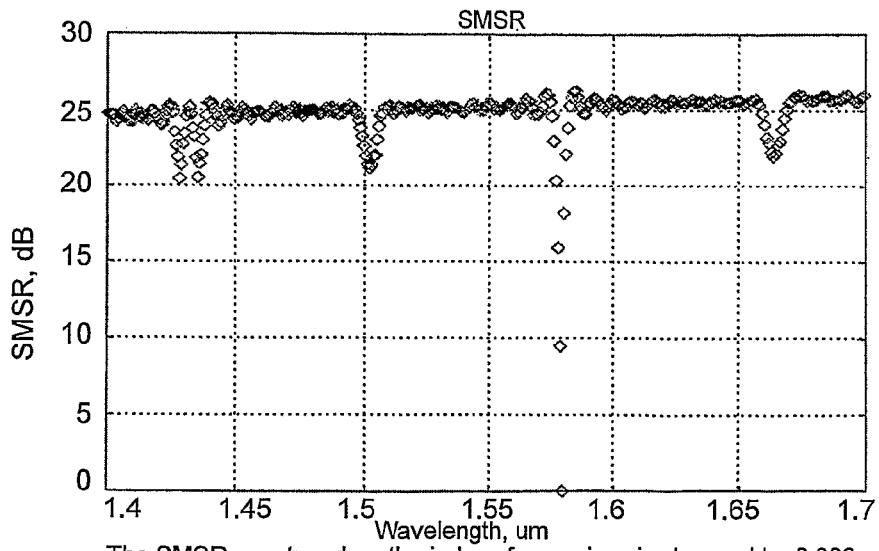
Figure 15:
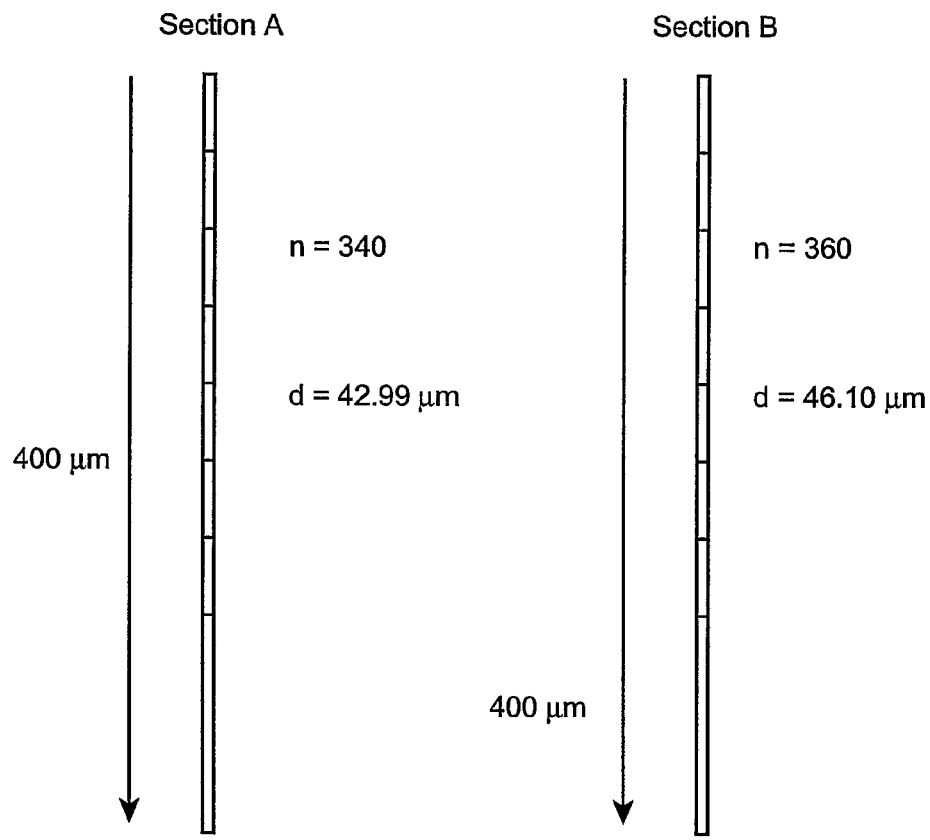
Figure 16:
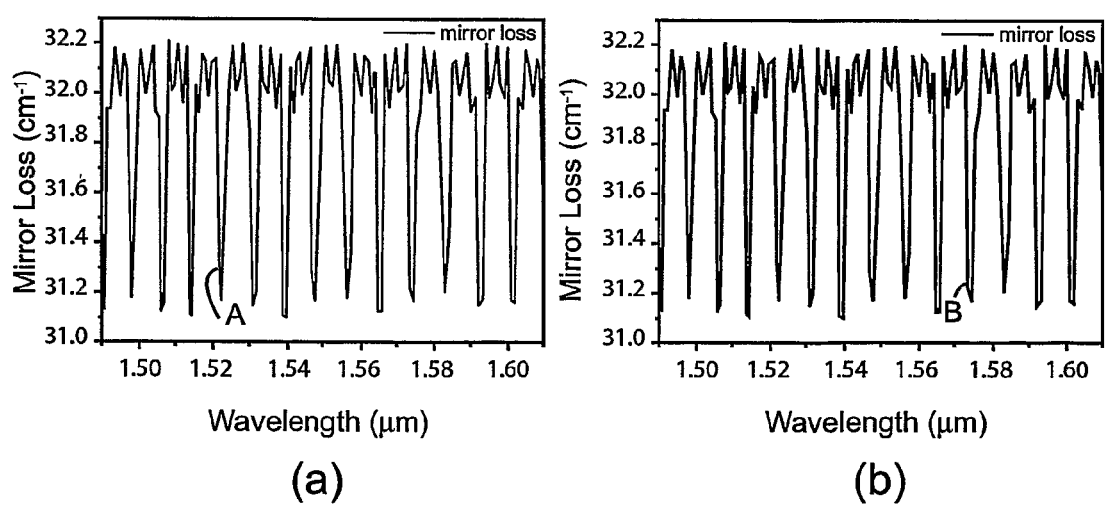
Figure 16C:
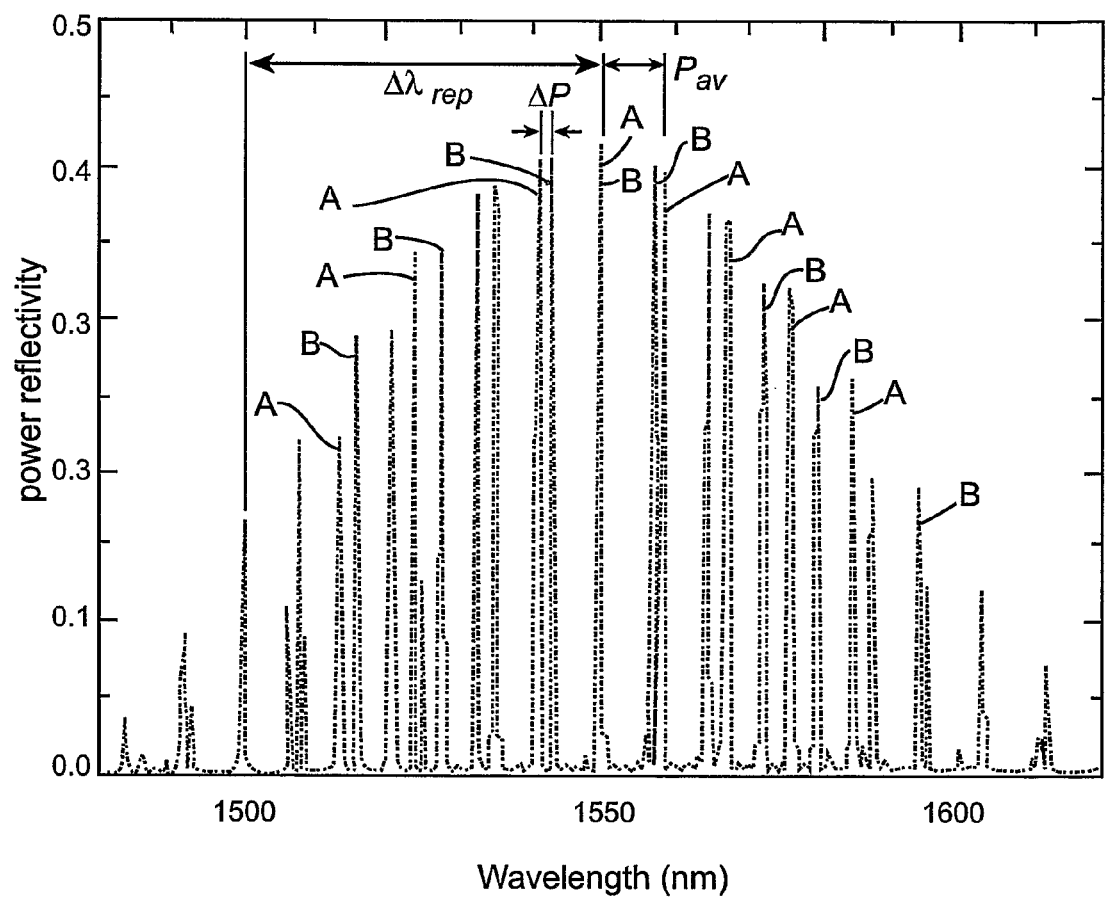
Figure 17:
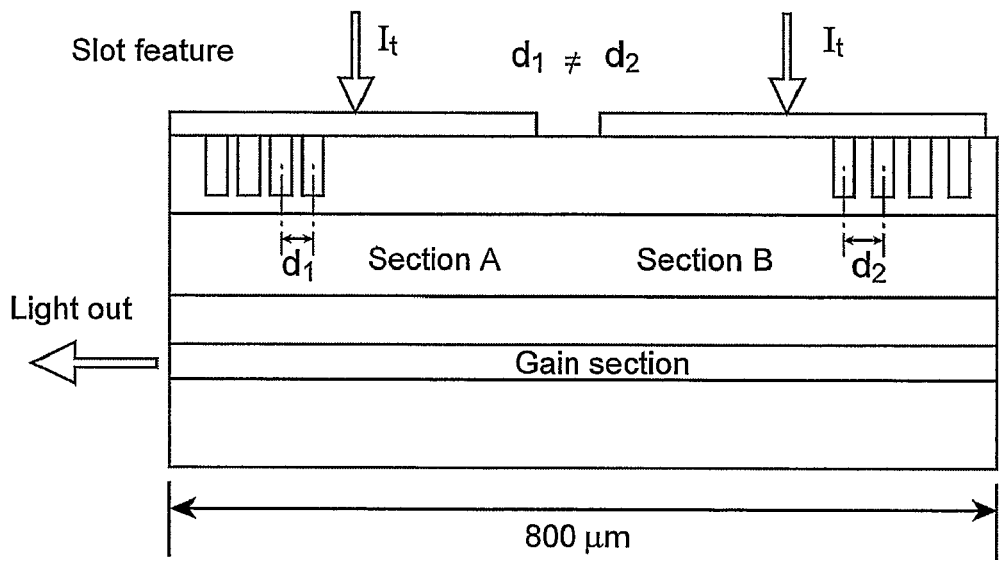
Figure 18:
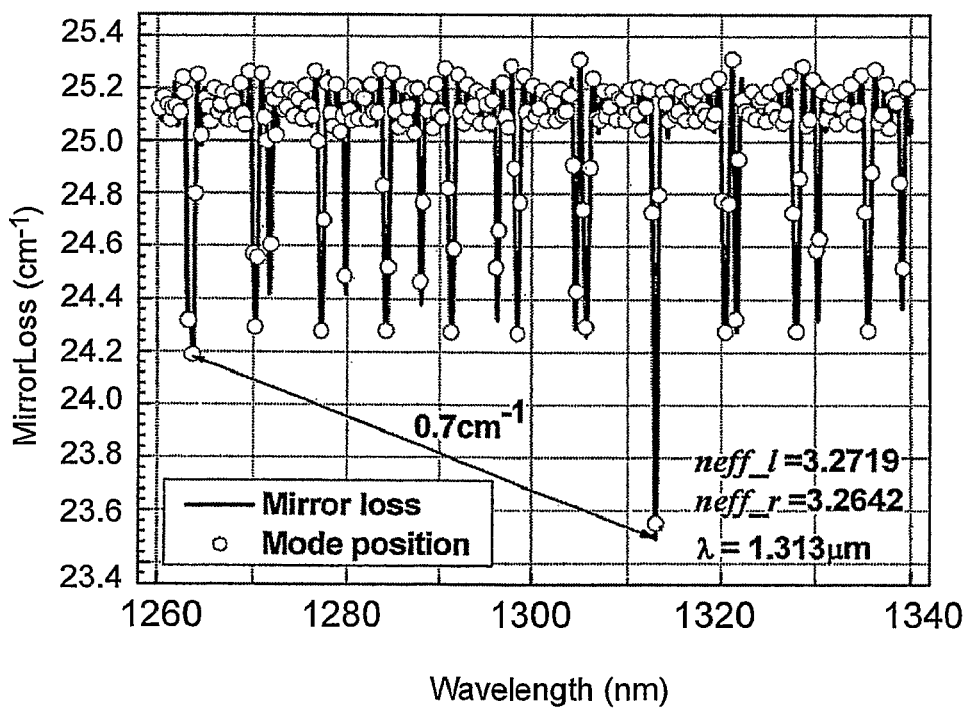
Figure 19:
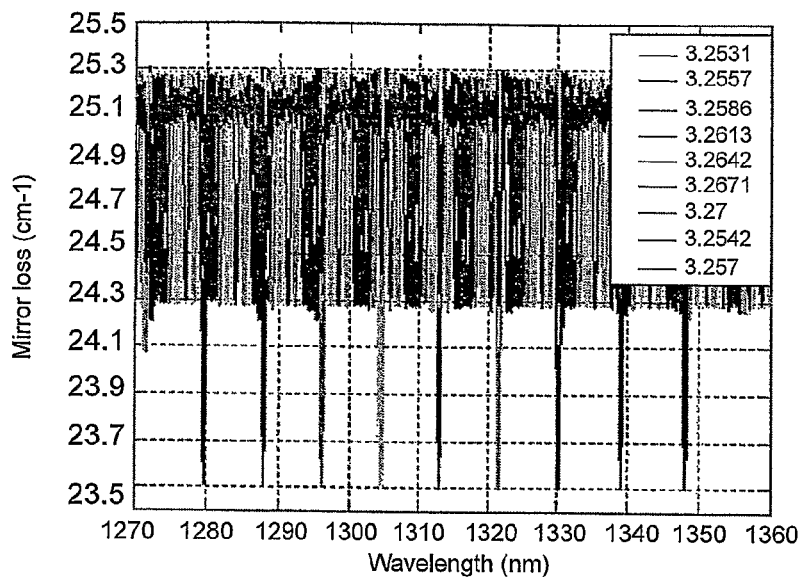
Figure 20:
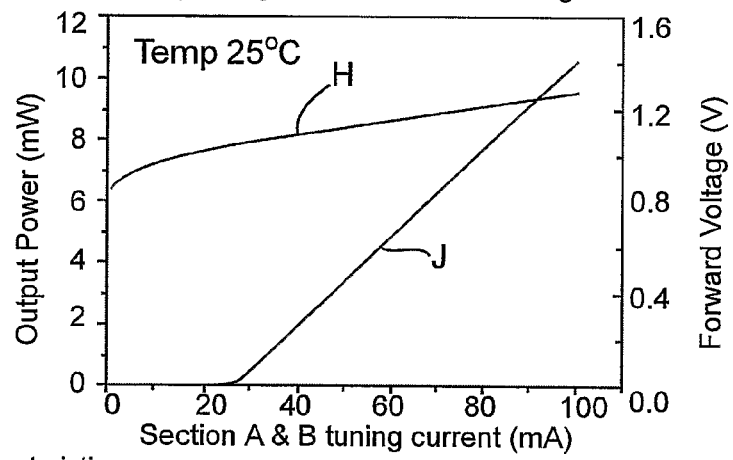
Figure 21:
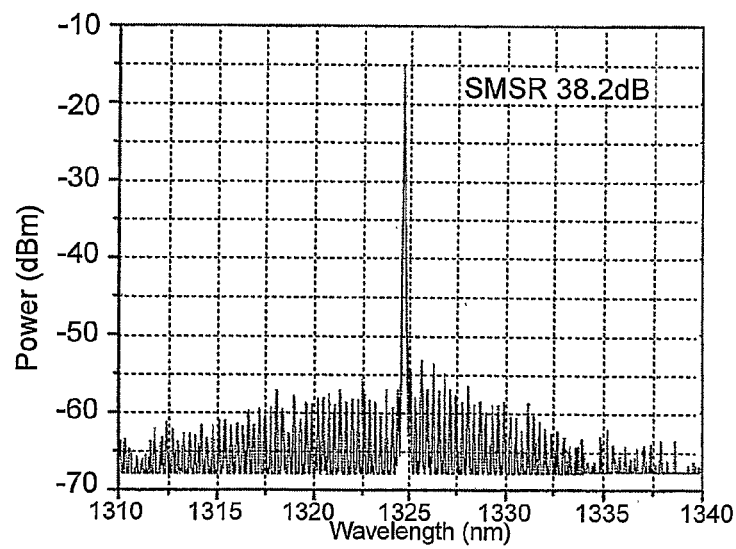
Figure 22:
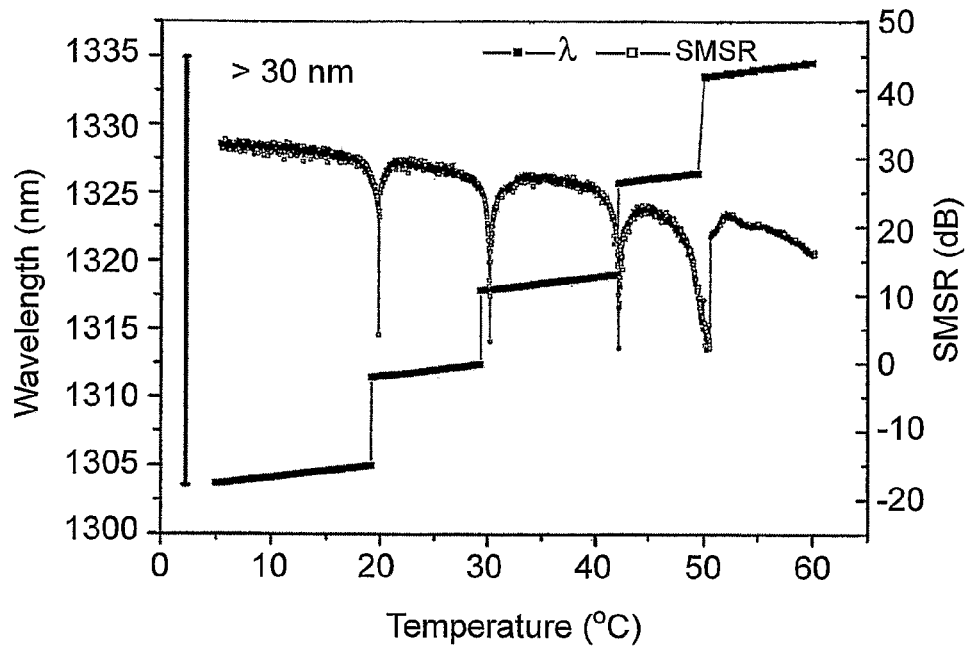
Figure 23:
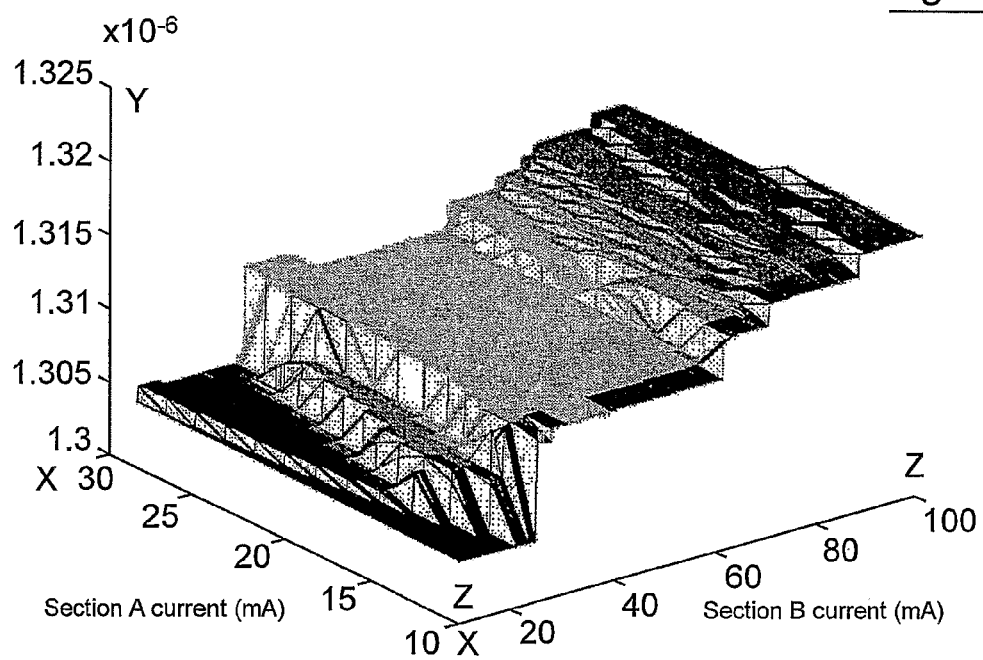
Figure 25:
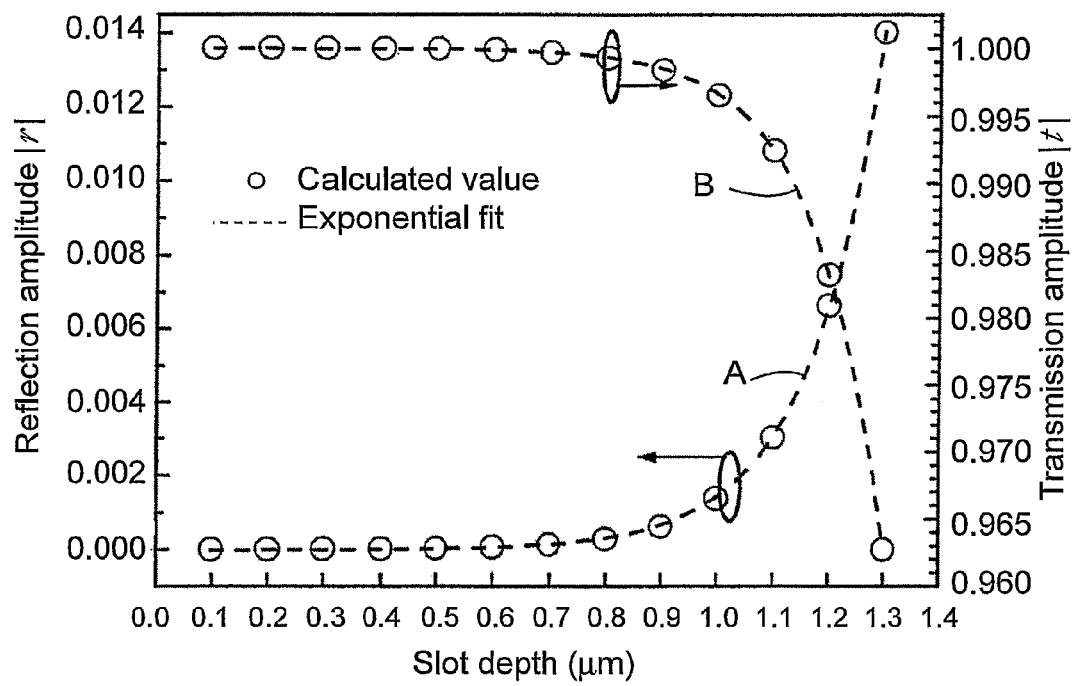
Figure 26:
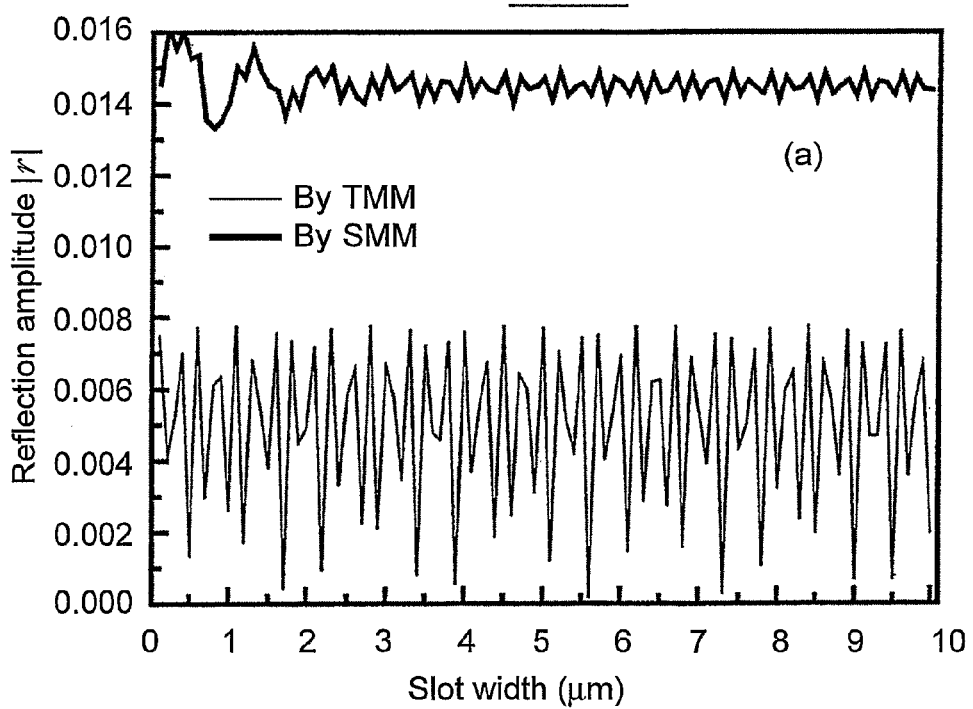

The invention will be more clearly understood from the following description of some embodiments thereof which are given by way of example only with reference to the accompanying drawings in which:

FIG. 1 is a side elevational view of a typical tunable laser device according to the invention, FIG. 2 is an end elevational view of the laser device of FIG. 1, FIG. 3 is a block representation of a control circuit for controlling the operation of the laser device of FIG. 1, FIG. 4 is a diagrammatic representation of another typical tunable laser device also according to the invention, FIG. 5 is a schematic representation of a right-hand side feedback section of the laser device of FIG. 4, FIG. 6 illustrates a waveform representative of the modulus of reflectivity from a grid of ten refractive index altering slots as a function of $\phi_s$ (units of $\pi$) referred to in Example 1 hereof, FIG. 7 illustrates a waveform representative of calculated reflectance from ten refractive index altering slots and the end facet plotted against wavelengths in microns of the laser device of FIG. 4, FIG. 8 illustrates a waveform representative of the reflectance from ten refractive index altering slots and the end facet when a phase shifter is used plotted against wavelengths in microns of the laser device of FIG. 4, FIG. 9 represents a plot of threshold gain spectrum plotted against wavelengths in microns of the laser device of FIG. 4, FIG. 10 illustrates waveforms of plots of reflectance against wavelengths in microns of the functions $|r_l|^2$, $|r_r|^2$ and $|r_l r_r|$ of the laser device of FIG. 4, FIG. 11 illustrates the threshold gain plotted against wavelengths in microns of the laser device of FIG. 4, FIG. 12 illustrates a plot of side mode suppression ratio in dB plotted against wavelength in microns for the laser device of FIG. 4, FIG. 13 illustrates waveforms of the reflectance spectra for the left and right mirrors (and their products) of the laser device of FIG. 4 when the index of one mirror is changed by 0.008, all of which are plotted against wavelengths in microns, FIG. 14 represents a plot of side mode suppression ratio in dB spectra plotted against wavelength in microns when the index of one mirror is changed by 0.008, FIG. 15 is a diagrammatic representation of first and second waveguides formed from a single waveguide of a tunable laser device of the type illustrated in FIGS. 1 to 3, FIGS. 16(a) and (b) are plots of the first and second mirror loss spectra of the first and second waveguides (sections A and B of FIG. 15 plotted against wavelengths in microns), FIG. 16(c) are plots of the power reflectivity against wavelength for the first and second waveguides (sections A and B of FIG. 15), FIG. 17 is a schematic representation of two sections A and B of a tunable laser device similar to the laser device of FIGS. 1 to 3, FIG. 18 illustrates waveforms of calculated mirror loss spectra for the two sections A, B incorporating different slot patterns in the two sections of the laser device of FIG. 17, FIG. 19 illustrates calculated mirror loss spectra for the two sections A and B illustrating super-mode hops obtained by tuning one section while leaving the other section fixed, FIG. 20 illustrates a plot of output power in mW plotted against tuning current in mA for the sections A and B of the laser device of FIG. 17, FIG. 21 illustrates a waveform representative of the emission spectrum of the laser device of FIG. 17 measured at a temperature of 25° C. with the sections A and B biased at 40 mA, FIG. 22 illustrates waveforms representing the emission spectrum and side mode suppression ratio of the laser device with sections A and B of the laser device of FIG. 17 biased at 40 mA versus heat sink temperature, FIG. 23 illustrates a three-dimensional representation of the emission spectrum of the laser device of FIG. 17 as a function of section A and section B biased current at a constant heat sink temperature, FIG. 24 is a three-dimensional representation of the side mode suppression ratio of the laser device of FIG. 17 as a function of section A and section B biased currents at a constant heat sink temperature, FIG. 25 illustrates a plot of reflection amplitude and transmission amplitude against depth of a refractive index altering slot where the slot is formed in a ridge of a ridge waveguide of a tunable laser device according to the invention, FIG. 26 is a plot of reflection amplitude against length of a refractive index altering slot in the direction of light propagation in a ridge waveguide of a tunable laser device according to the invention, FIG. 27 is a side-elevational view of a tunable laser device according to another embodiment of the invention, FIG. 28 is a top plan view of the tunable laser device of FIG. 27, and FIG. 29 is an end elevational view of the tunable laser device of FIG. 27.

Referring to the drawings and initially to FIGS. 1 to 3 thereof there is illustrated a typical tunable laser device according to the invention indicated generally by the reference numeral 1. The tunable laser device 1 as will be described below is tunable for producing laser light of selectable wavelengths within a relatively wide range of wavelengths about a centre wavelength, and the tuning may be continuous over the range of wavelengths or discontinuous. When tuning is continuous the wavelength of the light produced by the laser device 1 is progressively variable over the wavelength range from the lowest wavelength of the range to the highest wavelength of the range or vice-versa. When tuning is discontinuous the wavelength of the light is variable in steps, which may not necessarily progress sequentially from the lowest wavelength of the range to the highest thereof or vice versa.

The tunable laser device 1 is formed as a single integral waveguide unit by an integral ridge waveguide 2 which forms a first ridge waveguide 5 and a second ridge waveguide 6 arranged in series with each other, which co-operate as will be described below for producing light of the selectable wavelengths using a Vernier-tuning principle. However, before describing the co-operating action between the first and second waveguides 5 and 6, the construction of the first and second waveguides 5 and 6 in the integral ridge waveguide 2 will first be described.

The integral ridge waveguide 2 comprises a lower cladding layer 8 and an upper cladding layer 9, between which is located an active layer 10, which in this embodiment of the invention is formed by a plurality of quantum well layers. A ridge 12 formed in the upper cladding layer extends upwardly from the upper cladding layer 9, and defines a longitudinally extending light guiding region 13. The ridge 12 defines the lateral width in the X-direction of the light guiding region 13 in the active layer 10. The light guiding region 13 extends into adjacent portions of the lower and upper cladding layers 8 and 9 adjacent the active layer 10 beneath the ridge 12. A lower electrically conductive layer 14 on the underside of the lower cladding layer 8 and an upper electrically conductive layer 15 on the ridge 12 are provided for facilitating pumping of the first and second waveguides 5 and 6 with respective pumping currents as will be described below. The upper and lower cladding layers 8 and 9, the active region 10 and the ridge 12 form corresponding upper and lower cladding layers, active layers and ridges of the first and second waveguides 5 and 6.

An electrical isolating means comprising an electrical isolating slot 16 extends into and laterally across the ridge 12 to define the first and second waveguides 5 and 6 in the integral ridge waveguide 2, and also for electrically isolating the first and second waveguides 5 and 6 for permitting pumping of the first and second waveguides 5 and 6 with respective electrical pumping currents independently of each other. The isolating slot 16 also forms the ridge 12 into first and second ridges 17 and 18, respectively, of the first and second waveguides 5 and 6. The isolating slot 16 also defines first and second light guiding regions 19 and 20, respectively, of the respective first and second waveguides 5 and 6 in the light guiding region 13 of the integral ridge waveguide 2. First and second proximal ends 22 and 23 of the first and second waveguides 5 and 6 through which light passes between the first and second light guiding regions 19 and 20 are effectively defined by the isolating slot 16. End facets 24 of the integral ridge waveguide 2 are cleaved to form reflective first and second distal ends 25 and 26, respectively, of the respective first and second waveguides 5 and 6. In this embodiment of the invention light of the selected wavelength is emitted through the first distal end 25 of the first waveguide 5. In order to produce a sufficient degree of electrical isolation, the isolating slot 16 is formed in the ridge 12 to a depth substantially similar to the depth of the ridge 12.

A plurality of first refractive index altering means, in this embodiment of the invention provided by a plurality of equi-spaced apart, centre to centre, first slots 27 are formed in and extend laterally across the first ridge 17 of the first waveguide 5 for producing respective refractive index perturbations in the first light guiding region 19 at locations corresponding to the locations of the respective first slots 27. The refractive index perturbations resulting from the first slots 27 cause some of the lasing modes to undergo reflections which produces a first mirror loss spectrum of the first waveguide 5 with a plurality of minimum peak values at respective first wavelength values. A typical first mirror loss spectrum, which will be described below, is illustrated by the waveform A of FIG. 16(*a*). A plurality of second refractive index altering means provided by a plurality of equi-spaced apart, centre to centre, second slots 28 formed in and extending laterally across the second ridge 18 of the second waveguide 6 produce respective refractive index perturbations in the second light guiding region 20 at locations corresponding to the locations of the respective second slots 28. The refractive index perturbations in the second light guiding region 20 cause some of the lasing modes to undergo reflections, which produces a second mirror loss spectrum of the second waveguide 6 with a plurality of minimum peak values at respective second wavelength values. A typical second mirror loss spectrum, which will also be described below, is illustrated by the waveform B of FIG. 16(*b*).

The numbers of first and second slots 27 and 28 may be similar or may be different. The actual number of first and second slots may be any suitable number, and the choice of first and second slots is described in more detail below. The spacings of the first and second reflecting slots 27 and 28 are different to each other for producing the first and second mirror loss spectra with the minimum peak values thereof at the respective first and second wavelength values so that only one of the minimum values of the first mirror loss spectrum occurs at the same wavelength value at which one of the minimum values of the second mirror loss spectrum occurs. In other words, the first and second wavelength values at which the minimum peak values of the first and second mirror loss spectra occur are similar for only one of the minimum peak values of first and second mirror loss spectra. When two minimum peak values, one from each of the first and second mirror loss spectra occur at the same wavelength value, the first and second waveguides 5 and 6 co-operate to produce light of the wavelength value at which the two minimum peak values at the same wavelength value occur. The remaining modes of the light lasing in the first and second waveguides 5 and 6 are suppressed. Thus, by varying the wavelength value at which one of the minimum peak values of the respective first and second mirror loss spectra occur, the wavelength of the light produced by the laser device 1 can be selected using the principle of Vernier-tuning.

FIG. 16(*c*) illustrates a typical plot of power reflectivity against wavelength for the light produced by the respective first and second waveguides 5 and 6 based on the first and second mirror loss spectra of the waveforms A and B of FIGS. 16(*a*) and (*b*). The waveform A of FIG. 16(*c*) represents the power reflectivity of light produced by the first waveguide 5 based on the first mirror loss spectrum A of FIG. 16(*a*). The waveform B of FIG. 16(*c*) represent the power reflectivity of the light produced by the second waveguide 6 based on the second mirror spectrum B of FIG. 16(*b*). The wavelengths at which the peaks of the waveforms A and B of FIG. 16(*c*) occur correspond to the wavelengths at which the minimum peak values of the first and second mirror loss spectra A and B of FIGS. 16(*a*) and (*b*), respectively, occur. Since from FIGS. 16(*a*) and 16(*b*) the only common wavelength at which minimum peak values of the first and second mirror loss spectra A and B occur is approximately 1,550 nm, the only wavelength at which the peak values of the power reflectivities of the light produced by the first and second waveguides 5 and 6 coincide is approximately 1,550 nm. Thus, in this particular case, light is produced by the laser device 1 of wavelength of 1,550 nm. By varying the wavelengths at which the minimum peak values of the first and/or second mirror loss spectra A and B of FIGS. 16(*a*) and (*b*) occur, and the wavelength at which two minimum peak values, one from each of the first and second mirror loss spectrum A and B coincide, the wavelength of the light produced by the laser device 1 is varied.

A control circuit 29 for pumping electrical currents into the first and second waveguides 5 and 6 comprises a current source 30, which is operated under the control of a microcontroller 31 for producing a pumping current for injecting into the first and second waveguides 5 and 6. A refractive index varying means for independently varying the refractive indices of the first and second light guiding regions 19 and 20 of the respective first and second waveguides 5 and 6 for Vernier tuning of the laser devices 1 comprises respective first and second current sources 32 and 33 for producing first and second currents for pumping the first and second waveguides 5 and 6, respectively. The first and second currents produced by the first and second current sources 32 and 33 are independently variable. By varying the first and second currents with which the first and second waveguides 5 and 6 are pumped, the effective refractive indices of the first and second light guiding regions 19 and 20 of the respective first and second waveguides 5 and 6 are varied, and thus the wavelengths at which the minimum peak values of the respective first and second mirror loss spectra occur are also varied. Accordingly, by varying the first and second currents with which the first and second waveguides 5 and 6 are pumped, the wavelength of light produced by the laser device 1 can be varied. By varying the second current while holding the first current constant, or vice versa the tuning of the tunable laser device 1 is discontinuous. In other words, the wavelength of the light produced by the laser device 1 hops from one wavelength to another wavelength in wavelength steps. However, by simultaneously and appropriately varying the first and second currents, the tuning of the laser device 1 can be made to be continuous, whereby the light produced by the laser device 1 is progressively varied from light of the minimum wavelength of the tunable range to light of the maximum wavelength of the tunable range and vice versa.

In order to maintain the reflected modes from the first distal end facet 25 in phase with the reflected mode from the first slots 27, the first slot 27 which is closest to the first distal end 25 of the first waveguide 5 is spaced apart from the first distal end 25 a distance similar to the spacing between adjacent ones of the first slots 27. Similarly, in order to maintain the reflected modes from the second distal end facet 26 in phase with the reflected modes from the second slots 28, the spacing of the second slot 28 which is closest to the second distal end 26 of the second waveguide 6 is similar to the spacing between adjacent ones of the second slots 28. Additionally, both the first and second slots 27 and 28 are located towards the respective first and second distal ends 25 and 26 of the respective first and second waveguides 5 and 6. In order that the mirror loss spectra produced by the first and second waveguides 5 and 6 are different to each other, the spacing between the second slots 28 is greater than the spacing between the first slots 27.

In one embodiment of the invention the lower cladding layer 8 is of N-type material, and the upper cladding layer 9 and the ridge 12 are integrally grown and are of P-type material. The active layer 10 comprises five quantum well layers and is of AlGaInAs. The overall length of the integral ridge waveguide 2 is 800 microns, and the isolating slot 16 is located centrally intermediate the first and second distal ends 25 and 26, thereby forming the first and second waveguides 5 and 6 each of 400 microns approximately.

The spacing between the first slots 27 is determined from the following equation:

$$d_1 = \frac{N_1 \lambda}{4 n_{1eff,ave}} \quad (B1)$$

where
 $d_1$ is the spacing between adjacent ones of the first slots 27, centre to centre,
 $N_1$ is an integer from one upwards,
 $\lambda$ is the centre wavelength of light of the range of wavelengths of light over which the laser device 1 is tunable, and
 $n_{1\ eff,\ ave}$ is the average effective refractive index of the first light guiding region 19 of the first waveguide 5.

The spacing between the second slots 28 is determined from the following equation:

$$d_2 = \frac{N_2 \lambda}{4 n_{2eff,ave}} \quad (B2)$$

where
 $d_2$ is the spacing between adjacent ones of the second slots 28, centre to centre,
 $N_2$ is an integer from one upwards,
 $\lambda$ is the centre wavelength of light of the range of wavelengths of light over which the laser device 1 is tunable, and
 $n_{2\ eff,\ ave}$ is the average effective refractive index of the second light guiding region 20 of the second waveguide 6.

In one particular embodiment of the invention as will be described below with reference to Example 2 the integer number $N_1$ is selected to be 340, the centre wavelength $\lambda$ is selected to be 1,550 nanometres, the average effective refractive index $n_{1eff,ave}$ of the first light guiding region 19 of the first waveguide 5 in the absence of pumping current is 3.2, and thus from equation (B1) the spacing $d_1$ between the first slots 27 is 41 microns. The integer number $N_2$ is selected to be 360, the centre wavelength $\lambda$ is already selected as 1,550 nanometres, the average effective refractive index of the second light guiding cavity 20 of the second waveguide in the absence of pumping current is also 3.2, since the first and second waveguides 5 and 6 are integrally formed by the integral ridge waveguide 2. Thus, from equation (B2) the spacing $d_2$ between the second slots 28 is 43 microns. This produces a tunable laser device 1 which produces light within a tunable range of wavelengths from 1,500 nanometres to 1,600 nanometres which is centred around a centre wavelength of 1,550 nanometres, as will be described in more detail with reference to Example 2.

The number of first slots 27 formed in the first ridge 17 of the first waveguide 5 is nine, and the number of second slots 28 formed in the second ridge 18 of the second waveguide 6 is also nine. In any tunable laser device according to the invention the number of first and second slots is determined based on an optimisation of the reflection required to improve the selection of the selected mode over other lasing modes on the one hand and losses resulting from the first and second slots on the other hand.

The values of the first and second pumping currents are set so that the wavelength at which the minimum peak values of the first and second mirror loss spectra produced by the first and second waveguides 5 and 6, respectively, coincide at the desired wavelength at which the light is to be produced. One or both of the first and second pumping currents is varied to vary the corresponding one or both of the first and second mirror loss spectra, in order to vary the wavelength of the light produced.

It will be readily apparent to those skilled in the art that a tunable laser device according to the invention could be produced with a tunable wavelength range of 1,500 nanometres to 1,600 nanometres centred around a centre wavelength of 1,550 nanometres by selecting different values of the integer numbers $N_1$ and $N_2$. Furthermore, it will be appreciated that by varying the spacing $d_1$ and $d_2$ between the first and second slots 27 and 28, respectively, the tunable wavelength range may be varied. This will be well known and readily apparent to those skilled in the art.

In use, the control circuit 29 is operated for independently pumping the first and second waveguides 5 and 6 with first and second currents, which are independent of each other, and are independently variable. By holding one of the first and second currents constant and varying the other of the first and second pumping currents, tuning of the laser device 1 to produce light of respective selected wavelengths is discontinuous. However, by selectively varying the first and second currents simultaneously, tuning of the laser device 1 to produce light of selectable wavelengths can be made to be continuous, with the wavelength of the light being progressively selected from the minimum wavelength value of the selectable range to the maximum wavelength value of the selectable range and vice versa.

In order to provide a better understanding of the invention, two examples of tunable laser devices according to the invention together with an explanation of the theory behind the tunable laser devices will now be given with reference to the following two examples:

EXAMPLE 1

Consider the laser device 40 illustrated in FIG. 4, which is also according to the invention. The laser device 40 is integrally formed, and comprises first and second ridge waveguides 41 and 42, which for convenience will hereinafter be referred to as left and right feedback sections 41 and 42, respectively. Left slots 43 and right slots 44, which correspond to the first and second reflecting slots 27 and 28 are formed in the ridge 47 of the left and right feedback sections 41 and 42, respectively. A central gain section 45 is located between the left and right feedback sections 43 and 44 and in series therewith.

In this embodiment of the invention the gain section 45 is an active section, and the left and right feedback sections 41 and 42 may be passive or active. Where the gain section 45 and the left and right feedback sections 41 and 42 are all active sections, all three sections are independently pumped and the feedback sections 41 and 42 are pumped with respective independently variable currents. One or both of the pumping currents which pump the left and right feedback sections 41 and 42 are varied for varying the refractive index or the refractive indices of one or both of the light guiding regions of the respective left and right feedback sections 41 and 42, depending on whether one or both pumping currents are varied. By varying the refractive index or the refractive indices of one or both of the light guiding regions of the respective left and right feedback sections 41 and 42, the wavelength of the light produced by the laser device 40 is varied. On the other hand, where the left and right feedback sections 41 and 42 are passive sections, only the gain section is pumped, and independently variable tuning currents are injected into the left and right feedback sections 41 and 42, for the purpose of varying the refractive indices of one or both of the light guiding regions of the left and right feedback sections 41 and 42. The currents which are injected into the left and right feedback sections 41 and 42 are variable independently of each other, and variable independently of the pumping current of the gain section 45.

In what follows the left and right feedback sections 41 and 42 are considered to be passive lossless feedback sections.

Each of the left and right slots 43 and 44 have a reflectivity $r_d$ and a transmitivity of $t_d$. The distal end facets 46 have a reflectivity of $r_f$. Since the laser device 40 comprises a gain amplifier section 45 and the left and right feedback sections 41 and 42, the gain and refractive index of the light guiding regions of each section can be controlled independently of each other by varying the currents to the respective sections. In this example it is intended to calculate the complex reflectivities of the right and left feedback sections 43 and 44 as a function of wavelength $\lambda$, namely, the complex reflectivity $r_l(\lambda)$ of the left feedback section 41 and the complex reflectivity $r_r(\lambda)$ of the right feedback section 42, so that by solving the transverse resonance condition, $$r_r(\lambda)r_l(\lambda)\exp(-i2n_{cav}L_{cav})=1, \quad (A1)$$

where
$n_{cav}$ is the complex refractive index of the gain section 45,
$L_{cav}$ is the length of the gain section 45,
the resonant wavelengths $\lambda_m$ and the associated threshold gain, $g_{th}^m$ can be determined as, $$g_{th}^m = \frac{1}{L_{cav}} \ln\left(\frac{1}{|r_r(\lambda_m)r_l(\lambda_m)|}\right) \quad (A2)$$

where
$\lambda_m$ is the mode wavelength, and
m is the Fabry-Perot mode number.
The complex reflectivities, $r_l(\lambda)$ and $r_r(\lambda)$ of the left and right feedback sections 41 and 42 can be calculated by a matrix formalism or equivalently by repeated applications of the Fabry-Perot reflectivity expression as follows, $$r_r = r_{LHS} + \frac{t_{LHS}^2 r_{RHS}\exp(-i2\phi)}{1 - r_{LHS}r_{RHS}\exp(-i2\phi)} \quad (A3)$$

accounting for each slot reflectivity in turn in the order from the corresponding one of the distal end facet 46 towards the gain section 45.
Where
$r_{LHS}$ is the reflection coefficient (amplitude) for incidence from left-hand side of the slot,
$r_{RHS}$ is reflection coefficient (amplitude) for incidence from right-hand side of the slot,
t is the transmission coefficient (amplitude) of the slot left-hand or right-hand as appropriate,
$\phi$ is the phase accumulated as light propagates from one slot to its adjacent slot in the relevant left- or right-hand group of slots, and
i is the imaginary unit.
It should be noted that if there is gain in the feedback sections the feedback reflectivities can have moduli greater than unity. An analysis to predict the mode wavelength and threshold gain of each mode would therefore involve the following steps:
Set slot positions and number
Set gain in the left and right feedback sections 41 and 42 as $g_1$ and $g_3$
Calculate feedback reflectivities as a function of wavelength using equation (A3)
Find resonant wavelengths using equation (A1)
Find threshold gain in the amplifier section 45 as $g_2$ using equation (A2).
In general $g_2 \neq g_1, g_3$. If the left- and right-hand feedback sections 41 and 42 and the gain section 45 are completely coupled, then $g_1=g_2=g_3$, and the above sequence must be iterated to find a self-consistent solution.
Side Mode Suppression Ratio (SMSR)
An estimate for the SMSR for a Fabry-Perot cavity can be derived given knowledge of the threshold gain values as, $$SMSR = 1 + \frac{\Delta(|r_r r_l|)}{|r_r r_l|} \frac{2\lambda n_g}{g_{th}^2 L_{cav} hc^2 n_{sp}} P_R. \quad (A4)$$

where
$n_g$ is the group refractive index,
$g_{th}$ is the lowest threshold gain,
h is Plank constant,
c is the speed of light in a vacuum,
$n_{sp}$ is the spontaneous emission factor, and has a value of about 2, and
$P_R$ is the output power from the distal end facet 46 of the right feedback section 42.
Approximate Expression for Feedback Reflectivities
Consider the reflectivities $r_d$ of the right slots 44 and the facet 46 of the right feedback section 42 as illustrated in FIG. 5. Assuming an incident wave from the left, the reflected field will be due to two sources, firstly and most significantly, the laser facet and secondly, providing the perturbation, the slots:

$$r_r(\lambda)\exp(i2\phi_0) \approx r_f \exp\left(-i2\sum_1^N \phi_i\right) + \quad (A5)$$

-continued $$r_d\left(1 + \exp(-i2\phi_1) + \exp(-i2(\phi_1 + \phi_2)) + \ldots + \exp\left(-i2\sum_1^{N-1}\phi_i\right)\right)$$

where
N is the number of slots, and $$\phi_i = k_0 n L_i, \quad (A6)$$

where
i=0, 1, 2, 3 ... phase accumulated from one slot to another,
$k_0$ is the wave number in vacuum,
n is the effective refractive index of the waveguide, and
$L_i$ is the distance between slots.

The expression (A5) assumes that only contributions from a single round trip are significant. To maximise the feedback reflectivity all the reflections should be in-phase.

If it is assumed that the inter-slot spacing is constant then the reflectivity due to the slots alone, $r_s$, can be written, $$r_S = r_d(1 + \exp(-i2\phi_s) + \exp(-i4\phi_s) + \ldots + \exp(-i2(N-1)\phi_s)) \quad (A7)$$

where
$\phi_s$ is the phase shift accumulated as light propagates from one slot to its adjacent slot.

This finite geometric series can be summed as, $$r_S = r_d \frac{\exp(-i2\phi_s N) - 1}{\exp(-i2\phi_s) - 1} \quad (A8)$$

which can also be written as, $$r_S = |r_d|\exp(i\phi_d)\left|\frac{\sin(N\phi_s)}{\sin(\phi_s)}\right|\exp(i(1-N)\phi_s), \quad (A9)$$

where
$\phi_d$ is the phase of the slot reflection coefficient,
$\phi_s$ was assumed to be real, that is, the region of the feedback section containing the slots are assumed to be passive with no losses. The second modulus term of this expression is plotted in FIG. 6 for N=10. In FIG. 6 the modulus of reflectivity is plotted on the Y-axis and phase is plotted on the X-axis.

The slots therefore provide a filtering function in which the facet reflectivity will have a maximum modulation when $$\phi_s = \frac{2\pi}{\lambda}nL_s = m\pi \quad (A10)$$

where
n is the effective refractive index of the waveguide,
L is the distance between slots, and
m is an integer representing the order of the slots.

For wavelengths for which equation (A10) is true, the slot reflectivity given by equation (A9) becomes, $$r_S = |r_d|\exp(i\phi_d)N(-1)^{m(N-1)} \text{ (For } \phi_s = m\pi). \quad (A11)$$

The total reflectivity from one of the feedback sections will be the sum of that due to the facet alone, $r_F$, and the slots, $r_r = r_F + r_S$, where $$r_F = r_f \exp(-2iN\phi_s). \quad (A12)$$

In FIG. 7 the reflectance of a feedback section formed by 10 slots each spaced at 5 μm apart is illustrated. The defects are formed by a change in the real part of the refractive index in which case there is a π/2 phase change on reflection associated with them. This phase change, not experienced by the facet reflectivity, can be compensated by adding an extra quarter wavelength to the spacing between the final slot and the adjacent facet in which case the reflectance shown in FIG. 8 is obtained. Either response leads to an enhanced reflectance at wavelength intervals governed by the slot spacing. In FIGS. 7 and 8 reflectance is plotted on the Y-axis and wavelengths in microns is plotted on the X-axis.

Lasing

Expressions for the reflectivity from the feedback sections 41 and 42 have been obtained. If a gain section is provided separating identical left and right feedback sections, a laser is formed. For a cavity of an integer number of slot lengths, lasing near the high reflectivity resonances of the left and right feedback sections can be expected. Given the mirrors described in the previous section and a total length of 100 slot lengths (500 μm) the threshold gain spectrum shown in FIG. 9 was obtained. In FIG. 9 gain threshold in cm$^{-1}$ is plotted on the Y-axis and wavelength in microns is plotted on the X-axis.

Decreasing the length of the slot-to-slot spacing could reduce the number of resonances appearing in the bandwidth shown in FIG. 9. This advantage will be offset by an increase in the bandwidth of the resonance so that nearest neighbour lasing becomes more probable.

Vernier Effect

From equation (A2) it can be seen that the gain threshold is minimised by maximising the product of the reflectivities from the left and right feedback sections 41 and 42. By having slightly different slot spacings in each feedback section, lasing can be expected at only those resonances common to each feedback section. For example, to obtain lasing at 1.5 μm, for the left feedback section 41, the following equation must be satisfied:

$$\frac{2\pi}{\lambda}nL_{LHS} = m_L\pi. \quad (A13)$$

where
$L_{LHS}$ is the length of the left feedback section,
n is the effective refractive index, and
$m_L$ is an integer.

Assuming a refractive index of 3.15 and a slot length of 5 μm the integer $m_L$ is 21. An analogous expression to (A13) also applies to the right feedback section 42, which must also be resonant at 1.5 μm, and therefore, $$L_{RHS} = \frac{m_R}{m_L}L_{LHS} \quad (A14)$$

where
$L_{RHS}$ is the length of the right feedback section, and
$m_R$ is an integer.

Here $m_R$ is chosen to be 20 giving a 238 nm difference in slot spacing between the left and right slots. The reflectance of the left and right feedback section is shown in FIG. 10 along with the absolute value of the product of the reflectivities. The resulting gain thresholds and the side mode suppression ratio (SMSR) are illustrated in FIGS. 11 and 12. In FIG. 10 reflectance is plotted on the Y-axis and wavelength in microns is plotted on the X-axis. In FIG. 11 gain threshold in cm$^{-1}$ is plotted on the Y-axis and wavelength in microns is plotted on the X-axis. In FIG. 12 side mode suppression ratio (SMSR) in dB is plotted on the Y-axis and wavelength in microns is plotted on the X-axis.

Tuning

If the refractive indices of both the left and right feedback sections are changed simultaneously the resonant mode shifts, according to equation (A13) at a rate given by, $$\frac{d\lambda}{dn} = \frac{2L}{m}, \quad (A15)$$

where
L is the cavity length,
m is an integer, and
n is the effective refractive index,
so that, in this example, a 0.01 change of index changes the resonant wavelength by 5 nm.

By considering FIG. 10 it can be seen that whilst perfect alignment is achieved at the common resonant wavelength, $\lambda_c$, (here 1.5 μm) on either side the left and right mirrors are 'misaligned' by a wavelength difference $\Delta\lambda$. If the response of either of the mirrors is shifted by this amount the common resonance hops (in this example by about 75 nm) to the position corresponding to incrementing $m_L$ (or $m_R$) by ±1 (depending on the sign of the change of index to which mirror). The wavelength separations between the misaligned modes on either side of the aligned position are not equal. It is straightforward to show that on the long wavelength side the misalignment is given by, $$\Delta\lambda = \lambda_c \frac{(m_R - m_L)}{(m_L - 1)(m_R - 1)} \quad (A16)$$

where
$\lambda_c$ is the common resonant wavelength,
$m_R$ is an integer, and
$m_L$ is an integer.

Using equation (A15), the refractive index change, $\Delta n$, in a mirror to achieve this shift is, $$\Delta n = n \frac{(m_R - m_L)}{(m_L - 1)(m_R - 1)} \quad (A17)$$

On the short wavelength side, $$\Delta\lambda = \lambda_c \frac{(m_L - m_R)}{(m_L + 1)(m_R + 1)}. \quad (A18)$$

and $$\Delta n = n \frac{(m_L - m_R)}{(m_L + 1)(m_R + 1)} \quad (A19)$$

It is therefore slightly 'easier' to hop to shorter wavelengths. In the example treated here the differential index change required to obtain a mode hop of 75 nm to longer wavelengths is only $\Delta n \sim 0.008$. The reflectance and resultant side mode suppression ratio spectra for this tuned laser are shown in FIGS. 13 and 14. In this case $m_L$ and $m_R$ differ by only 1. Choosing this to be a larger value will make the discrete tuning lower geared, even to the point that the single mode might be very stable to variations in mirror indices. In FIG. 13 reflectance is plotted on the Y-axis and wavelength in microns is plotted on the X-axis. In FIG. 14 side mode suppression ratio in dB is, plotted on the Y-axis, and wavelength in microns is plotted on the X-axis.

In Example 1 a laser comprising of a central gain section coupled to two passive, lossless sections containing a distribution of reflectors has been described. By having a regular and identical grid distribution of slots in each passive feedback section, a comb response can be obtained. By having non-identical grid periodicities, a single resonance can be obtained (within the gain bandwidth) at the resonance common to both mirrors. It has been shown that a very highly geared discrete tuning, between the resonances of the comb, is possible by controlling the difference in index between the two feedback sections. A much lower geared, continuous tuning is achieved by varying the refractive indices of the light guiding regions of the left and right feedback sections simultaneously. Continuous tuning over a very large range is possible if the comb spacing matched the maximum continuous tuning range.

EXAMPLE 2

Widely Tunable Slotted Fabry-Pérot Laser (WT-SFP)

In the case of a widely tunable laser employing the Vernier effect the free spectral range (FSR) is required to be narrow (≈7 nm), so as to produce a comb of mirror loss minima. By increasing the value of N in equation (B1) or (B2) the FSR in the mirror loss spectrum can be reduced. FIG. 15 illustrates two structures of a laser device according to the invention which is of a similar general construction to that of the laser device 1 described with reference to FIGS. 1 to 3. In the laser device of FIG. 15 the value of N has been increased to 340 and 360 resulting in a slot positions spacing $d_1$ is 42.99 μm in the first waveguide or feedback section (structure A) and $d_2$ is 46.10 μm in the second waveguide or feedback section (structure B). FIG. 16 displays the corresponding mirror loss spectra for these two feedback sections A and B with a resulting FSR of 7 nm and 6.5 nm.

For Vernier effect tuning, it is necessary that the effective refractive index of each feedback section A and B can be varied independently. To achieve this effect, an electrical isolating slot which is similar to the electrical isolating slot 16 of the laser device of FIGS. 1 to 3 is formed in the centre of a ridge of the structures A and B, which is similar to the ridge 12 of the laser device of FIGS. 1 to 3, so that the first and second pumping currents of the feedback sections A and B can be varied independently of each other. The tunable laser device is schematically illustrated in FIG. 17, the laser device is split into two sections, namely, the first waveguide or feedback section A and the second waveguide or feedback section B by etching the isolating slot into the ridge. In a working device the resistance between the two sections was measured to be 1 kΩ. The slot periods in the first and second feedback sections A and B are slightly different. The active layer consists of 5 quantum wells material InAlGaAs/InP, operating at 1310 nm. The cavity length is 800 μm with nine slots per section the width of each slot is 1 μm with a slot depth of 0.9 μm.

The slot positions in the two section device are
Section B
800 μm Facet
761.2547 μm
722.5094 μm
683.7641 μm
645.0188 μm 606.2735 µm
567.5282 µm
528.7829 µm
490.0376 µm
451.2923 µm
Section A
321.28046 µm
285.59396 µm
249.90746 µm
214.22096 µm
178.53446 µm
142.84796 µm
107.16146 µm
71.47496 µm
35.78846 µm
0 Facet Thus, the comb-like mirror loss spectra of each feedback section A and B possess a slightly different periodicity, which permits the use of Vernier-effect tuning to achieve quasi-continuous wavelength coverage.

FIG. 18 illustrates another example of the calculated mirror loss spectra of the tunable laser device with the two feedback sections A and B that are similar to the ones employed in the devices of FIGS. 1 to 3 and 15 to 17. In this case the number and spacing of the first and second slots in the feedback sections A and B, respectively, are selected to produce the laser device with a tuning range from 1,260 nanometres to 1,340 nanometres. Lasing occurs at the wavelength where reflection peaks of both tuning feedback sections A and B line up best, which in this case is at a wavelength of 1313 nm in the present example. Large wavelength jumps, so-called super mode hops, are obtained by varying the pumping current of one of the feedback sections A and B, while leaving the pumping current of the other one of the feedback sections A and B unchanged as shown in FIG. 19, whereas continuous tuning is obtained by simultaneously varying the pumping currents of the respective feedback sections A and B. In FIG. 19 mirror loss is plotted in cm$^{-1}$ on the Y-axis and wavelength in microns is plotted on the X-axis.

Tuning Characteristics

In the following, data from an 800 µm long tunable laser device is presented. Characterisation of the laser device was carried out at a heat sink temperature of 25° C. Light-current and voltage-current characteristics of the laser device are shown in FIG. 20. The lasing threshold is reached at a current of 28 mA and a voltage of 0.89 V. In FIG. 20 output power in milliwatts is plotted on one of the Y-axes, and forward voltage in volts is plotted on the other Y-axis. The pumping current in milliamps for the feedback sections A and B is plotted on the X-axis. The waveform H represents the forward voltage version of the feedback sections A and B tuning current. The waveform J represents the output power of the laser version of the feedback sections A and B tuning current.

For the spectral characterisation, the light emitted by this laser device was collected with a lens ended single mode fibre butt coupled to the front facet of the laser. A fibre coupled output power of 10 mW was obtained at a current of 100 mA. The optical characteristics of the diode were measured using an optical spectrum analyser. FIG. 21 shows the emission spectrum from the laser at a temperature of 25° C. with the feedback sections A and B biased at 40 mA respectively. The device lases in a single mode with an SMSR of 38.2 dB. In FIG. 21 power in dBm is plotted on the Y-axis and wavelength in nm is plotted on the X-axis.

The extended tuning range of the laser device was measured with a fixed current of 40 mA into the feedback sections A and B with the heat sink temperature varied from 5 to 60° C. The discontinuous tuning jumps are due to new reflection modes coming into alignment. A maximum discontinuous tuning range of 30 nm was achieved as shown in FIG. 22. In FIG. 22 wavelength in nanometres is plotted on one Y-axis and side mode suppression ratio in dB is plotted on the other Y-axis, while temperature in degrees centigrade is plotted on the X-axis.

FIGS. 23 and 24 show the behaviour of the emission wavelength and the SMSR as functions of the two pumping currents of the respective feedback sections A and B. During the measurement of these tuning characteristics, the heat sink temperature was fixed at 25° C. It can be seen in FIG. 23 that there are several bands, also referred to as super modes (which can be more easily recognised by identifying the regions of high SMSR), where continuous tuning can be carried out by varying both tuning currents simultaneously. Within the super modes, the emission wavelength is shifting towards longer wavelength, which is characteristic for electro thermal tuning. In FIG. 23 wavelength in microns is plotted on the Y-axis, current in milliamps which is injected into the feedback section B is plotted on the X-axis and current in milliamps which is injected into the feedback section A is plotted on the X-axis. In FIG. 24 the side mode suppression ratio in decibels is plotted on the Y-axis, the current in milliamps which is injected into the feedback section B is plotted on the X-axis and the current in milliamps which is injected into the feedback section A is plotted on the Z-axis.

Referring now to FIG. 25, a plot of reflection amplitude |r| and transmission amplitude |t| against slot depth is illustrated. As can be seen from the waveform A of FIG. 25, which is a plot of reflection amplitude against slot depth, the reflection amplitude increases with slot depth. However, from the waveform B of FIG. 25, which is a plot of transmission amplitude against slot depth, the light transmission amplitude decreases with slot depth, and thus, a trade-off must be made reflection amplitude and transmission amplitude when selecting slot depth of the first and second slots. Additionally, in order to minimise internal losses in the laser devices it is necessary to keep the number of first and second slots to a minimum. This requires a slot pattern which provides just enough optical feedback to ensure that the laser operates in a single longitudinal mode over the wide tuning range of interest.

It is also important that the length of the first and second slots, in other words, the length of the first and second slots in the direction of light propagation is relatively small, typically, less than 3 µm. This is required in order to ensure that the internal loss in the respective first and second light guiding regions is minimised, since the internal losses in the light guiding regions is substantially higher under the first and second slots than elsewhere in the first and second light guiding regions, and also as a result of the fact that the dopant concentration in semiconductor material at the bottom of a slot may be less than one-tenth of the level adjacent the dopant level adjacent the top of the ridge, and thus, it would be difficult if not impossible to create a low resistance metal contact on the ridge adjacent the bottom of the first and second slots. Thus, if the length of the slots in the direction of light propagation is increased arbitrarily, a portion of the waveguide beneath the slot will remain unpumped.

FIG. 26 illustrates a plot of reflection amplitude r against slot length in the direction of light propagation.

Referring now to FIGS. 27 and 28 there is illustrated a tunable laser device according to another embodiment of the invention which is indicated generally by the reference numeral 70. The tunable laser device 70 comprises a ridge waveguide 71 which is substantially similar to the ridge waveguide 2 of the tunable laser device 1, and comprise upper and lower cladding layers 72 and 73 and an active layer 74 located between the upper and lower cladding layers 72 and 73. A ridge 77 formed in the upper cladding layer 72 defines a light guiding region 78 which extends the length of the waveguide 71. Upper and lower electrically conductive layers 80 and 81 are provided on the ridge 77 and on the lower cladding layer 73, respectively.

In this embodiment of the invention the waveguide 71 defines a first waveguide 82 and a second waveguide 83, as well as a gain section 84 and a phase section 85 located intermediate the first and second waveguides 82 and 83. The first and second waveguides 82 and 83, the gain section 84 and the phase section 85 are arranged in series with each other. First and second lateral slots 86 and 87 are formed in the ridge 77 in the first waveguide 82 and the second waveguide 83 to form respective feedback sections in the first and second waveguides 82 and 83. An electrical isolating slot 90 electrically isolates the gain section 84 from the phase section 85, and electrical isolating slots 91 and 92 isolate the first and second waveguides 82 and 83 from the gain section 84 and the phase section 85, respectively. Accordingly, the first and second waveguides 82 and 83 and the gain and phase section 84 and 85 can be independently pumped, or electrical currents can be independently injected into the respective first and second waveguides 82 and 83 and the gain section 84 and the phase section 85, independently of each other.

Operation of the tunable laser device 70 is substantially similar to operation of the tunable laser device 40 of FIG. 4. The first and second waveguide sections 82 and 83 may be passive or active, and if active are pumped by independently variable pumping currents for varying the wavelength of light produced. If on the other hand the first and second waveguides 82 and 83 are passive, independently variable tunable currents are injected into the first and second waveguides 82 and 83 for varying the wavelength of light produced by the device 70. The gain region 84 is pumped independently of the first and second waveguides 82 and 83 and of the phase section 85, and a suitable phase controlling current is injected into the phase section 85 for controlling the phase of light produced by the tunable laser device 70.

While the laser devices according to the invention have been described as comprising an integral ridge waveguide which integrally incorporates the first and second ridge waveguides or feedback sections, so that the first and second light guiding regions are axially aligned and communicate directly with each other, it is envisaged in certain cases that the tunable laser devices according to the invention may be provided by first and second waveguides separately formed, and where the first and second waveguides have been formed as two separate units, the first and second waveguides may be brought together with their respective first and second light guiding regions aligned and communicating directly with each other, or the first and second waveguides may be spaced apart from each other with the first and second light guiding regions optically coupled, and in which case, the first and second light guiding regions need not be axially aligned. The optical coupling of the first and second light guiding regions may be carried out by any suitable optical coupler, for example an optical fibre, a separate laser diode, or as already described, a separate gain section, or the like.

It is also envisaged that the laser devices according to the invention may be provided by an integral ridge waveform of arcuate shape.

It is also envisaged that the laser device according to the invention may be provided by a buried heterostructure waveguide. In such a structure, slots would be formed in the waveguide before the growth or regrowth of the upper cladding layers of such a structure.

Furthermore, while the laser devices according to the invention has been described as comprising only a first and second waveguide, it is envisaged in certain cases that the laser device may be provided with more than two waveguides, for example, three, four or more waveguides for further enhancing the resolution between selectable wavelengths. Each of the ridge waveguides will include an appropriate number of refractive index altering means appropriately spaced apart in their respective ridges. However, it will be appreciated that in general the spacing between the refractive index altering means will be different from ridge waveguide to ridge waveguide. Additionally, where more than two ridge waveguides are provided, the ridge waveguides may be formed integrally in a single integral ridge waveguide, or may be formed separately of each other. Each ridge waveguide would be individually pumped or injected with tuning currents for facilitating independently varying the refractive indices of the light guiding regions of the respective ridge waveguides.

While the refractive index altering means have been described as being formed by first and second slots, any other suitable refractive index altering means which causes a refractive index perturbation in the light guiding region of each ridge waveguide or feedback section may be used besides a slot in the ridge of the ridge waveguide.

The invention claimed is:

1. A tunable laser device for producing light of respective selectable wavelengths, the tunable laser device comprising:
a first ridge waveguide extending between a first proximal end and a first distal end, and having a first ridge defining a first light guiding region extending in a longitudinal direction between the first proximal end and the first distal end thereof,
a second ridge waveguide extending between a second proximal end and a second distal end, and having a second ridge defining a second light guiding region extending in a longitudinal direction between the second proximal end and the second distal end thereof,
the first and second light guiding regions communicating through the first and second proximal ends thereof, and emitting light of the selectable wavelength through one of the first and second distal ends,
a plurality of first refractive index altering means equispaced apart along the first ridge of the first waveguide for altering the refractive index of the first light guiding region at spaced apart locations therein to produce a first mirror loss spectrum with minimum peak values at respective first wavelength values,
the spacing $d_1$ between adjacent ones of the first refractive index altering means centre to centre being determined by the equation:

$$d_1 = \frac{N_1 \lambda}{4 n_{1\mathit{eff},ave}}$$

where
$N_1$ is an integer from one upwards,
$\lambda$ is the centre wavelength of the range of wavelengths of light over which the laser device is to be tunable, and
$n_{1\ \mathit{eff,\ ave}}$ is the average effective refractive index of the first light guiding region,
a plurality of second refractive index altering means equispaced apart along the second ridge of the second waveguide for altering the refractive index of the second light guiding region at spaced apart locations therein to produce a second mirror loss spectrum with minimum peak values at respective second wavelength values, the spacing $d_2$ between adjacent ones of the second refractive index altering means centre to centre being different to the spacing $d_1$ between the first refractive index altering means and being determined by the equation:

$$d_2 = \frac{N_2 \lambda}{4 n_{2eff,ave}}$$

where $N_2$ is an integer from one upwards, $\lambda$ is the centre wavelength of the range of wavelengths of light over which the laser device is to be tunable, and $n_{2\ eff,\ ave}$ is the average effective refractive index of the second light guiding region, and a refractive index varying means for selectively varying the refractive index of at least the first light guiding region for in turn varying the first mirror loss spectrum until one of the first wavelength values is similar to one of the second wavelength values to produce light of a selected one of the wavelengths.

2. A tunable laser device as claimed in claim 1 in which the first and second refractive index altering means are adapted for altering the refractive index of the respective first and second light guiding regions at locations corresponding to the respective locations of the first and second refractive index altering means.

3. A tunable laser device as claimed in claim 1 in which the refractive index varying means comprises a means for selectively varying the refractive indices of the respective first and second light guiding regions independently of each other.

4. A tunable laser device as claimed in claim 1 in which a gain section is located intermediate the first and second waveguides for producing light for the first and second waveguides.

5. A tunable laser device as claimed in claim 1 in which each first refractive index altering means comprises a first slot formed in the first ridge of the first waveguide and extending laterally across the first ridge, and each second refractive index altering means comprises a second slot formed in the second ridge of the second waveguide and extending laterally across the second ridge.

6. A tunable laser device as claimed in claim 1 in which the respective first refractive index altering means are located towards the first distal end of the first waveguide, and the respective second refractive index altering means are located towards the second distal end of the second waveguide.

7. A tunable laser device as claimed in claim 1 in which the first and second light guiding regions of the respective first and second waveguides are aligned longitudinally with each other for communication therebetween through the first and second proximal ends thereof.

8. A tunable laser device as claimed in claim 1 in which the first and second ridge waveguides comprise first and second laser diodes, respectively.

9. A tunable laser device as claimed in claim 1 in which the value of $N_2$ is different to the value of $N_1$.

10. A tunable laser device as claim in claim 1 in which the refractive index varying means comprises a first current injecting means for injecting a first electrical current into the first waveguide to vary the refractive index of the first light guiding region, and a second current injecting means for injecting a second electrical current into the second waveguide to vary the refractive index of the second light guiding region.

11. A tunable laser device as claimed in claim 10 in which the first current injecting means comprises a means for selectively varying the first current.

12. A tunable laser device as claimed in claim 10 in which the second current injecting means comprises a means for selectively varying the second current, the first and second current injecting means being independently operable for independently selecting the values of the first and second currents.

13. A tunable laser device as claimed in claim 4 in which the gain section is adapted to be pumped with a pumping current independently of the first and second waveguides.

14. A tunable laser device as claimed in claim 4 in which a phase section is located intermediate the gain section and one of the first and second waveguides for controlling the phase of the light.

15. A tunable laser device as claimed in claim 14 in which the phase section is adapted to be injected with a phase controlling current independently of the gain section and the first and second waveguides.

16. A tunable laser device as claimed in claim 1 in which the first and second waveguides are passive waveguides.

17. A tunable laser device as claimed in claim 1 in which the first and second waveguides are active waveguides and are adapted to be pumped with respective pumping currents independently of each other.

18. A tunable laser device as claimed in claim 1 in which the first and second waveguides are integrally formed from a ridge waveguide having a single light guiding region.

19. A tunable laser device as claimed in claim 1 in which an electrical isolating means is provided for substantially electrically isolating the first current in the first light guiding region and the second current in the second light guiding region from each other.

20. A tunable laser device as claimed in claim 1 in which the wavelength of light produced by the tunable laser device is selected using a Vernier principle.

21. A method for producing light of respective selectable wavelengths, the method comprising:

providing a first ridge waveguide extending between a first proximal end and a first distal end, and having a first ridge defining a first light guiding region extending in a longitudinal direction between the first proximal end and the first distal end thereof, providing a second ridge waveguide extending between a second proximal end and a second distal end, and having a second ridge defining a second light guiding region extending in a longitudinal direction between the second proximal end and the second distal end thereof, providing the first and second light guiding regions communicating through the first and second proximal ends thereof, and emitting light of the selectable wavelength through one of the first and second distal ends, providing a plurality of first refractive index altering means equi-spaced apart along the first ridge of the first waveguide for altering the refractive index of the first light guiding region at spaced apart locations therein to produce a first mirror loss spectrum with minimum peak values at respective first wavelength values, determining the spacing $d_1$ between adjacent ones of the first refractive index altering means centre to centre from the equation:

$$d_1 = \frac{N_1 \lambda}{4n_{1\mathit{eff},ave}}$$

where
- $N_1$ is an integer from one upwards,
- $\lambda$ is the centre wavelength of the range of wavelengths of light over which the laser device is to be tunable, and
- $n_{1\ \mathit{eff},\ ave}$ is the average effective refractive index of the first light guiding region, providing a plurality of second refractive index altering means equi-spaced apart along the second ridge of the second waveguide for altering the refractive index of the second light guiding region at spaced apart locations therein to produce a second mirror loss spectrum with minimum peak values at respective second wavelength values, the spacing between the second refractive index altering means being different to the spacing between the first refractive index altering means, determining the spacing $d_2$ between adjacent ones of the second refractive index altering means centre to centre from the equation:

$$d_2 = \frac{N_2 \lambda}{4n_{2\mathit{eff},ave}}$$

where
- $N_2$ is an integer from one upwards,
- $\lambda$ is the centre wavelength of the range of wavelengths of light over which the laser device is to be tunable, and
- $n_{2\ \mathit{eff},\ ave}$ is the average effective refractive index of the second light guiding region, providing a refractive index varying means for selectively varying the refractive index of at least the first light guiding region, and varying the first mirror loss spectrum by operating the refractive index varying means to vary the refractive index of the first light guiding region until one of the first wavelength values is similar to the one of the second wavelength values at which the minimum peak value of the second mirror loss spectrum corresponding to the selected wavelength occurs.

\* \* \* \* \*